United States Patent
Okigawa et al.

(10) Patent No.: US 12,107,137 B2
(45) Date of Patent: *Oct. 1, 2024

(54) SEMICONDUCTOR DEVICE

(71) Applicant: FLOSFIA INC., Kyoto (JP)

(72) Inventors: Mitsuru Okigawa, Kyoto (JP); Fujio Okui, Kyoto (JP); Yasushi Higuchi, Kyoto (JP); Koji Amazutsumi, Kyoto (JP); Hidetaka Shibata, Kyoto (JP); Yuji Kato, Kyoto (JP); Atsushi Terai, Kyoto (JP)

(73) Assignee: FLOSFIA INC., Kyoto (JP)

( * ) Notice: Subject to any disclaimer, the term of this patent is extended or adjusted under 35 U.S.C. 154(b) by 287 days.

This patent is subject to a terminal disclaimer.

(21) Appl. No.: 17/834,089

(22) Filed: Jun. 7, 2022

(65) Prior Publication Data

US 2022/0393015 A1    Dec. 8, 2022

(30) Foreign Application Priority Data

Jun. 7, 2021 (JP) ................. 2021-095499
Jun. 1, 2022 (JP) ................. 2022-089958

(51) Int. Cl.
*H01L 29/06* (2006.01)
*H01L 29/47* (2006.01)
*H01L 29/872* (2006.01)

(52) U.S. Cl.
CPC ........ *H01L 29/475* (2013.01); *H01L 29/0649* (2013.01); *H01L 29/872* (2013.01)

(58) Field of Classification Search
CPC .. H01L 29/0649; H01L 29/475; H01L 29/872
(Continued)

(56) References Cited

U.S. PATENT DOCUMENTS

2005/0184355 A1    8/2005 Okada
2015/0194479 A1    7/2015 Kaneko et al.
(Continued)

FOREIGN PATENT DOCUMENTS

JP    2008-251757    10/2008
JP    6344718        6/2018
(Continued)

OTHER PUBLICATIONS

Jun Liang Zhao et al. "UV and Visible Electroluminescence From a Sn:Ga$_2$O$_3$/n$^+$—Si Heterojunction by Metal-Organic Chemical Vapor Deposition", IEEE Transactions on Electron Devices, vol. 58, No. 5, May 2011, pp. 1447-1451.
Kohei Sasaki et al., "Si-Ion Implantation Doping in a β-Ga$_2$O$_3$ and Its Application to Fabrication of Low-Resistance Ohmic Contacts", Applied Physics Express 6 (2013), pp. 086502-1-086502-4.
Extended European Search Report issued Oct. 21, 2022, in European Patent Aplication No. 22177497.9.
(Continued)

*Primary Examiner* — Monica D Harrison
(74) *Attorney, Agent, or Firm* — Wenderoth, Lind & Ponack, L.L.P.

(57) ABSTRACT

Provided is a semiconductor device in which a leakage current is reduced, the semiconductor device which is particularly useful for power devices. A semiconductor device including at least: an n+-type semiconductor layer, which contains a crystalline oxide semiconductor as a major component; an n−-type semiconductor layer that is placed on the n+-type semiconductor layer, the n−-type semiconductor layer containing a crystalline oxide semiconductor as a major component; a high-resistance layer with at least a part thereof being embedded in the n−-type semiconductor layer, the high-resistance layer having a bottom surface located at a distance of less than 1.5 μm from an upper surface of the n+-type semiconductor layer; and a Schottky electrode that forms a Schottky junction with the n−-type semiconductor layer, the Schottky electrode having an edge located on the high-resistance layer.

14 Claims, 15 Drawing Sheets

(58) Field of Classification Search
USPC .......................................................... 257/471
See application file for complete search history.

(56) References Cited

U.S. PATENT DOCUMENTS

| | | |
|---|---|---|
| 2016/0042949 A1 | 2/2016 | Sasaki et al. |
| 2018/0240864 A1 | 8/2018 | Nagaoka |
| 2020/0287060 A1 | 9/2020 | Arima et al. |
| 2022/0393037 A1* | 12/2022 | Okigawa ............... H01L 29/872 |

FOREIGN PATENT DOCUMENTS

| | | |
|---|---|---|
| JP | 2019-050290 | 3/2019 |
| WO | 2014/050793 | 4/2014 |
| WO | 2021/246528 | 12/2021 |

OTHER PUBLICATIONS

Hengyu Wang et al., "Trench Termination With $SiO_2$-Encapsulated Dielectric for Near-Ideal Breakdown Voltage in 4H—SiC Devices", IEEE Electron Device Letters, vol. 39, No. 12, Dec. 2018, pp. 1900-1903.

Korean Office Action issued Feb. 26, 2024 in corresponding Korean Patent Application No. 10-2022-0069152, with English machine translation.

Xue HuiWen et al., "An Overview of the Ultrawide Bandgap $Ga_2O_3$ Semiconductor-Based Schottky Barrier Diode for Power Electronics Application", Nanoscale Research Letters (2018), vol. 13, No. 290, pp. 1-13.

* cited by examiner

SEMICONDUCTOR DEVICE

CROSS REFERENCE TO RELATED APPLICATION

This application is a new U.S. patent application that claims priority benefits of Japanese Patent Applications No. 2021-095499 (filed on Jun. 7, 2021) and No. 2022-089958 (filed on Jun. 1, 2022).

The entire contents of the above applications, which the present application is based on, are incorporated herein by reference.

1. FIELD OF THE INVENTION

The present disclosure relates to a semiconductor device that is useful as a power device and the like.

2. DESCRIPTION OF THE RELATED ART

Gallium oxide ($Ga_2O_3$) is a transparent semiconductor that has a wide band gap of 4.8 to 5.3 eV at room temperature and absorbs almost no visible light and ultraviolet light. For this reason, gallium oxide ($Ga_2O_3$) is a promising material to be used in photonic devices and transparent electronics that operate in a deep ultraviolet light range, in particular, and the development of photodetectors, light-emitting diodes (LEDs), and transistors based on gallium oxide ($Ga_2O_3$) has been conducted in recent years. Such gallium oxide makes band gap control possible by mixing thereinto indium or aluminum or a combination of indium and aluminum and constitutes a very attractive family of materials as InAlGaO-based semiconductors. Here, InAlGaO-based semiconductors indicate $In_XAl_YGa_ZO_3$ ($0 \leq X \leq 2$, $0 \leq Y \leq 2$, $0 \leq Z \leq 2$, $X+Y+Z=1.5$ to $2.5$) and may be regarded as a family of materials including gallium oxide.

Moreover, gallium oxide ($Ga_2O_3$) has five crystal structures: $\alpha$, $\beta$, $\gamma$, $\sigma$, and $\varepsilon$ and, in general, the most stable structure is $\beta$-$Ga_2O_3$. However, $\beta$-$Ga_2O_3$ is a $\beta$ gallia structure, which is different from a crystal system that is generally used in electronic materials and so forth; therefore, $\beta$-$Ga_2O_3$ is not always suitable for use in semiconductor devices. Furthermore, the growth of a $\beta$-$Ga_2O_3$ thin film requires a high substrate temperature and a high degree of vacuum, which results in an increase in production cost. In addition, even a high concentration (for example, $1 \times 10^{19}/cm^3$ or more) of dopant (Si) could not be used in $\beta$-$Ga_2O_3$ as donors unless annealing treatment was performed at high temperatures of 800 to 1100° C. after ion implantation.

On the other hand, $\alpha$-$Ga_2O_3$ has the same crystal structure as that of a sapphire substrate that is already used widely, and is therefore suitable for use in photonic devices. In addition, $\alpha$-$Ga_2O_3$ has a wider band gap than $\beta$-$Ga_2O_3$ and is therefore particularly useful for power devices. For these reasons, a semiconductor device using $\alpha$-$Ga_2O_3$ as a semiconductor is eagerly anticipated.

A Schottky barrier diode including: a semiconductor substrate formed of gallium oxide; a drift layer formed of gallium oxide and provided on the semiconductor substrate; an anode electrode in Schottky contact with the drift layer; and a cathode electrode in ohmic contact with the semiconductor substrate, wherein the drift layer has an outer trench provided so as to surround the anode electrode when viewed in a plan view has been known. Moreover, a crystal multilayer structure including: a $Ga_2O_3$-based high-resistance crystal layer containing Mg and ion implantation damage and having a thickness of 750 nm or less; and an inclined-impurity-concentration layer containing a lower concentration of the Mg than the $Ga_2O_3$-based high-resistance crystal layer, the concentration of the Mg being inclined in a depth direction, the inclined-impurity-concentration layer being located below the $Ga_2O_3$-based high-resistance crystal layer and having a thickness of 100 nm or more has been known.

However, in the semiconductor devices, a leakage current near the edge of the Schottky electrode or at the interface between the Schottky electrode and the high-resistance crystal layer poses a problem, which makes it impossible to obtain a semiconductor device that is satisfactory from a practical standpoint.

SUMMARY OF THE INVENTION

According to an example of the present disclosure, there is provided a semiconductor device including at least: an n+-type semiconductor layer, which contains a crystalline oxide semiconductor as a major component; an n--type semiconductor layer that is placed on the n+-type semiconductor layer, the n--type semiconductor layer containing a crystalline oxide semiconductor as a major component; a high-resistance layer with at least a part thereof being embedded in the n--type semiconductor layer, the high-resistance layer having a bottom surface located at a distance of less than 1.5 μm from an upper surface of the n+-type semiconductor layer; and a Schottky electrode that forms a Schottky junction with the n--type semiconductor layer, the Schottky electrode having an edge located on the high-resistance layer.

Thus, in a semiconductor device of the present disclosure, a leakage current is suppressed.

DETAILED DESCRIPTION

Figure 1:
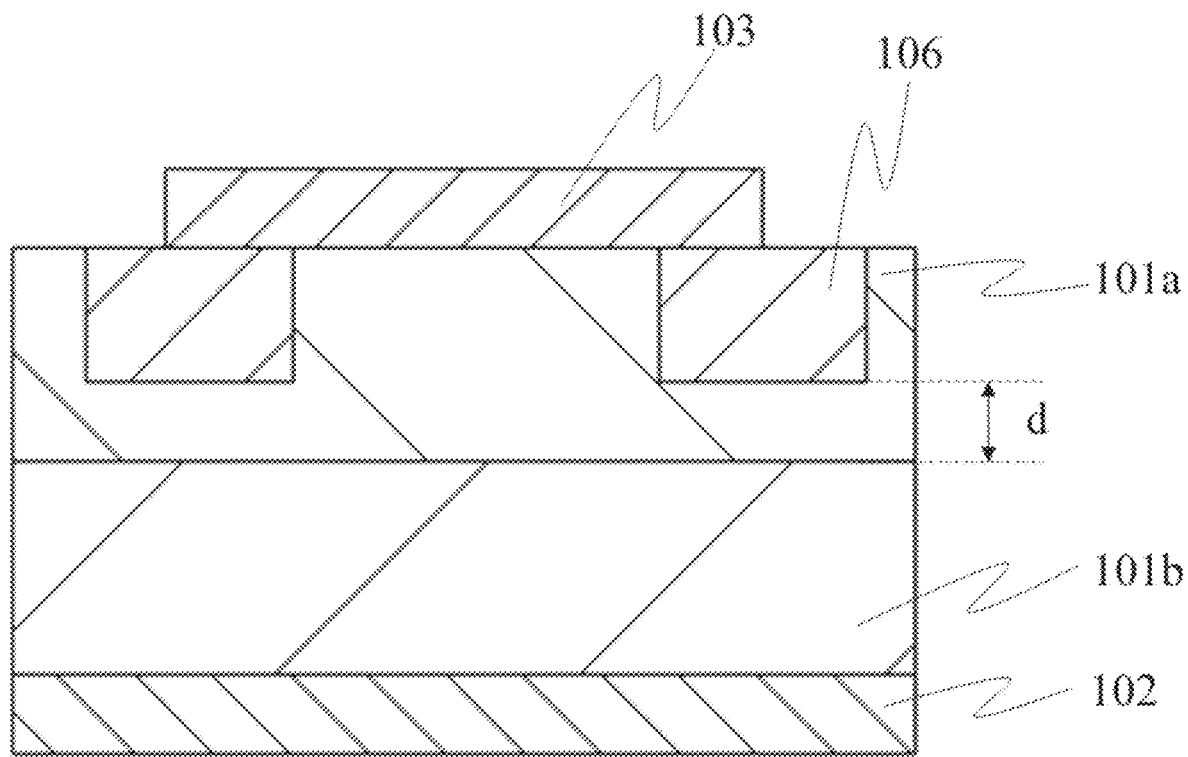
FIG. 1 is a diagram schematically showing a Schottky barrier diode (SBD) according to an embodiment of the present disclosure.

The inventors of the present disclosure found out that a semiconductor device including at least: an n+-type semiconductor layer, which contains a crystalline oxide semiconductor as a major component; an n−-type semiconductor layer that is placed on the n+-type semiconductor layer, the n−-type semiconductor layer containing a crystalline oxide semiconductor as a major component; a high-resistance layer with at least a part thereof being embedded in the n−-type semiconductor layer, the high-resistance layer having a bottom surface located at a distance of less than 1.5 from an upper surface of the n+-type semiconductor layer; and a Schottky electrode, which has an edge located on the high-resistance layer, may reduce a leakage current and found out that the semiconductor device obtained in this manner may solve the above-described conventional problems.

Embodiments of the present disclosure will be described below with reference to the accompanying drawings. In the following description, the same parts and components are designated by the same reference numerals. The present embodiment includes, for example, the following disclosures.

[Structure 1]

A semiconductor device including at least: an n+-type semiconductor layer, which contains a crystalline oxide semiconductor as a major component; an n−-type semiconductor layer that is placed on the n+-type semiconductor layer, the n−-type semiconductor layer containing a crystalline oxide semiconductor as a major component; a high-resistance layer with at least a part thereof being embedded in the n−-type semiconductor layer, the high-resistance layer having a bottom surface located at a distance of less than 1.5 μm from an upper surface of the n+-type semiconductor layer; and a Schottky electrode that forms a Schottky junction with the n−-type semiconductor layer, the Schottky electrode having an edge located on the high-resistance layer.

[Structure 2]

The semiconductor device according to [Structure 1] above, wherein the crystalline oxide semiconductor contains one or two or more types of metals selected from aluminum, indium, and gallium.

[Structure 3]

The semiconductor device according to [Structure 1] or [Structure 2] above, wherein the crystalline oxide semiconductor contains at least gallium.

[Structure 4]

The semiconductor device according to any one of [Structure 1] to [Structure 3] above, wherein the crystalline oxide semiconductor has a corundum structure or a β gallia structure.

[Structure 5]

The semiconductor device according to any one of [Structure 1] to [Structure 4] above, wherein a distance between the bottom surface of the high-resistance layer and the upper surface of the n+-type semiconductor layer is 1.0 μm or less.

[Structure 6]

The semiconductor device according to any one of [Structure 1] to [Structure 5] above, wherein the bottom surface of the high-resistance layer is flush with an interface between the n+-type semiconductor layer and the n−-type semiconductor layer or is located below the interface between the n+-type semiconductor layer and the n−-type semiconductor layer.

[Structure 7]

The semiconductor device according to any one of [Structure 1] to [Structure 6] above, wherein the high-resistance layer contains Sift.

[Structure 8]

The semiconductor device according to any one of [Structure 1] to [Structure 7] above, further including: an insulator layer that is formed on the n−-type semiconductor layer, the insulator layer on which the edge of the Schottky electrode is located.

[Structure 9]

The semiconductor device according to any one of [Structure 1] to [Structure 8] above, wherein the high-resistance layer has a first region located on an inside of the semiconductor device and a second region located on an outside of the semiconductor device, wherein a distance between a bottom surface of the first region and the upper surface of the n+-type semiconductor layer is less than 1.5 μm, and wherein a bottom surface of the second region is located above the bottom surface of the first region.

[Structure 10]

The semiconductor device according to any one of [Structure 1] to [Structure 9] above, further including: a passivation film that covers an outer edge of the Schottky electrode and at least a part of a surface of the n−-type semiconductor layer.

[Structure 11]

The semiconductor device according to any one of [Structure 1] to [Structure 10] above, wherein the semiconductor device is a diode.

[Structure 12]

The semiconductor device according to any one of [Structure 1] to [Structure 11] above, wherein the semiconductor device is a power device.

[Structure 13]

A power converter, wherein the semiconductor device according to any one of [Structure 1] to [Structure 12] above is used.

[Structure 14]

A control system, wherein the semiconductor device according to any one of [Structure 1] to [Structure 12] above is used.

A semiconductor device of the present disclosure is a semiconductor device including at least: an n+-type semiconductor layer, which contains a crystalline oxide semiconductor as a major component; an n--type semiconductor layer that is placed on the n+-type semiconductor layer, the n--type semiconductor layer containing a crystalline oxide semiconductor as a major component; a high-resistance layer with at least a part thereof being embedded in the n--type semiconductor layer, the high-resistance layer having a bottom surface located at a distance of less than 1.5 from an upper surface of the n+-type semiconductor layer; and a Schottky electrode that forms a Schottky junction with the n--type semiconductor layer.

The n+-type semiconductor layer (hereinafter also referred to simply as the "semiconductor layer" or the "semiconductor film") is not limited to a particular semiconductor layer as long as the semiconductor layer is a semiconductor layer having a higher carrier density than the n--type semiconductor layer (hereinafter also referred to simply as the "semiconductor layer" or the "semiconductor film") and containing a crystalline oxide semiconductor as a major component. Examples of the crystalline oxide semiconductor include a metal oxide containing one or two or more types of metal selected from aluminum, gallium, indium, iron, chromium, vanadium, titanium, rhodium, nickel, cobalt, and iridium. In an embodiment of the present disclosure, the crystalline oxide semiconductor preferably contains at least one type of metal selected from aluminum, indium, and gallium, more preferably contains at least gallium, and is most preferably $\alpha\text{-}Ga_2O_3$ or a mixed crystal thereof. According to an embodiment of the present disclosure, even when, for example, a semiconductor with a wide band gap such as gallium oxide or a mixed crystal thereof is used, it is possible to reduce a leakage current in a satisfactory manner. A crystal structure of the crystalline oxide semiconductor is also not limited to a particular crystal structure unless it interferes with the object of the present disclosure. Examples of the crystal structure of the crystalline oxide semiconductor include a corundum structure, a β-gallia structure, a hexagonal structure (for example, an ε-type structure), an orthorhombic structure (for example, a κ-type structure), a cubic structure, a tetragonal structure or the like. In an embodiment of the present disclosure, the crystalline oxide semiconductor preferably has a corundum structure, a β-gallia structure, or a hexagonal structure (for example, an ε-type structure) and more preferably has a corundum structure. It is to be noted that a "major component" means that the crystalline oxide semiconductor constitutes preferably 50% or more, more preferably 70% or more, and further preferably 90% or more of all the components of the n+-type semiconductor layer in terms of atom ratio and the crystalline oxide semiconductor may constitute 100% of all the components of the n+-type semiconductor layer in terms of atom ratio. Moreover, the thickness of the n+-type semiconductor layer is not limited to a particular thickness and may be 1 μm or less or 1 μm or more; in an embodiment of the present disclosure, the thickness of the n+-type semiconductor layer is preferably 1 μm or more and more preferably 3 μm or more. The area of the semiconductor film when viewed in a plan view is not limited to a particular area and may be 1 mm² or more or 1 mm² or less; the area of the semiconductor film when viewed in a plan view is preferably 10 mm² to 300 cm² and more preferably 100 mm² to 100 cm². Furthermore, the +-type semiconductor layer is usually a monocrystal, but may be a polycrystal. The carrier density of the semiconductor layer may be appropriately set by adjusting the doping amount.

It is preferable that the n+-type semiconductor layer contains dopant. The dopant is not limited to particular dopant and may be publicly known dopant. In an embodiment of the present disclosure, in particular, when a major component of the semiconductor layer is a crystalline oxide semiconductor containing gallium, suitable examples of the dopant include n-type dopant such as tin, germanium, silicon, titanium, zirconium, vanadium, or niobium. In an embodiment of the present disclosure, it is preferable that the n-type dopant is Sn, Ge, or Si. The content of dopant in the composition of the semiconductor layer is preferably 0.00001 at % or more, more preferably 0.00001 to 20 at %, and most preferably 0.00001 to 10 at %. More specifically, in general, the concentration of dopant may be about $1\times10^{16}/cm^3$ to $1\times10^{22}/cm^3$. In an embodiment of the present disclosure, the semiconductor layer may be made to contain dopant at a high concentration of about $1\times10^{20}/cm^3$ or more. In an embodiment of the present disclosure, it is preferable to make the semiconductor layer contain dopant at a carrier concentration of $1\times10^{17}/cm^3$ or more.

The n--type semiconductor layer is not limited to a particular semiconductor layer as long as the semiconductor layer is a semiconductor layer having a lower carrier density than the n+-type semiconductor layer and containing a crystalline oxide semiconductor as a major component. Examples of the crystalline oxide semiconductor include a metal oxide containing one or two or more types of metal selected from aluminum, gallium, indium, iron, chromium, vanadium, titanium, rhodium, nickel, cobalt, and iridium. In an embodiment of the present disclosure, the crystalline oxide semiconductor preferably contains at least one type of metal selected from aluminum, indium, and gallium, more preferably contains at least gallium, and is most preferably $\alpha\text{-}Ga_2O_3$ or a mixed crystal thereof. It is to be noted that, in an embodiment of the present disclosure, the crystalline oxide semiconductor which is the major component of the n+-type semiconductor layer and the crystalline oxide semiconductor which is the major component of the n--type semiconductor layer may be the same or different from each other. A crystal structure of the crystalline oxide semiconductor is also not limited to a particular crystal structure unless it interferes with the object of the present disclosure. Examples of the crystal structure of the crystalline oxide semiconductor include a corundum structure, a β-gallia structure, a hexagonal structure (for example, an ε-type structure), an orthorhombic structure (for example, a κ-type structure), a cubic structure, a tetragonal structure or the like. In an embodiment of the present disclosure, the crystalline oxide semiconductor preferably has a corundum structure, a β-gallia structure, or a hexagonal structure (for example, an ε-type structure) and more preferably has a corundum structure. It is to be noted that a "major component" means that the crystalline oxide semiconductor constitutes preferably 50% or more, more preferably 70% or more, and further preferably 90% or more of all the components of the n--type semiconductor layer in terms of atom ratio and the crystalline oxide semiconductor may constitute 100% of all the components of the n--type semiconductor layer in terms of atom ratio. Moreover, the thickness of the n--type semiconductor layer is not limited to a particular thickness and may be 1 μm or less or 1 μm or more; in an embodiment of the present disclosure, the thickness of the n--type semiconductor layer is preferably 3 μm or more. The area of the semiconductor film when viewed in a plan view is not limited to a particular area and may be 1 mm² or more or 1 mm² or less; the area of the semiconductor film when viewed in a plan view is preferably 10 mm² to 300 cm² and more preferably 100 mm² to 100 cm². Furthermore, the semiconductor layer is usually a monocrystal, but may be a polycrystal. The carrier density of the semiconductor layer may be appropriately set by adjusting the doping amount.

The n--type semiconductor layer may contain dopant. The dopant is not limited to particular dopant and may be publicly known dopant. In an embodiment of the present disclosure, in particular, when a major component of the semiconductor layer is a crystalline oxide semiconductor containing gallium, suitable examples of the dopant include n-type dopant such as tin, germanium, silicon, titanium, zirconium, vanadium, or niobium. In an embodiment of the present disclosure, it is preferable that the n-type dopant is Sn, Ge, or Si. The content of dopant in the composition of the semiconductor layer is preferably 0.00001 at % or more, more preferably 0.00001 to 20 at %, and most preferably 0.00001 to 10 at %. More specifically, in general, the concentration of dopant may be about $1 \times 10^{16}/cm^3$ to $1 \times 10^{22}/cm^3$, or the concentration of dopant may be set at a low concentration of about $1 \times 10^{17}/cm^3$ or less, for example.

The high-resistance layer is not limited to a particular high-resistance layer as long as the high-resistance layer is a high-resistance layer with at least a part thereof being embedded in the n--type semiconductor layer. The high-resistance layer generally has a resistance of $1.0 \times 10^6$ Ω·cm or higher. In an embodiment of the present disclosure, the resistance of the high-resistance layer is preferably $1.0 \times 10^{10}$ Ω·cm or higher and more preferably $1.0 \times 10^{12}$ Ω·cm or higher. The resistance can be measured by forming a measuring electrode in the high-resistance layer and passing a current. The upper limit of the resistance is not limited to a particular upper limit. The upper limit of the resistance is preferably $1.0 \times 10^{15}$ Ω·cm and more preferably $1.0 \times 10^{14}$ Ω·cm. A constituent material for the high-resistance layer is not limited to a particular constituent material unless it interferes with the object of the present disclosure. In an embodiment of the present disclosure, it is preferable that the high-resistance layer is an insulator layer. In this case, examples of the constituent material for the high-resistance layer include $SiO_2$, phosphorus-doped $SiO_2$ (PSG), boron-doped $SiO_2$, and phosphorus- and boron-doped $SiO_2$ (BPSG). Examples of a method of forming the high-resistance layer include CVD, atmospheric pressure CVD, plasma CVD, and mist CVD. In an embodiment of the present disclosure, it is preferable that a method of forming the high-resistance layer is mist CVD or atmospheric pressure CVD. Moreover, in an embodiment of the present disclosure, it is also preferable that a major component of the high-resistance layer is the crystalline oxide semiconductor. When a major component of the high-resistance layer is the crystalline oxide semiconductor, it is also preferable that the high-resistance layer contains p-type dopant. Examples of the p-type dopant include magnesium, calcium, and zinc.

The distance between a bottom surface of the high-resistance layer and an upper surface of the n+-type semiconductor layer is not limited to a particular distance as long as the distance is less than 1.5 μm. In an embodiment of the present disclosure, the distance between the bottom surface of the high-resistance layer and the upper surface of the n+-type semiconductor layer is preferably 1.0 μm or less and more preferably 0.5 μm or less. Moreover, in an embodiment of the present disclosure, the bottom surface of the high-resistance layer may be flush with the interface between the n+-type semiconductor layer and the n--type semiconductor layer or may be located below the interface between the n+-type semiconductor layer and the n--type semiconductor layer. This preferred configuration makes it possible to achieve the semiconductor device in which a leakage current is further reduced. Furthermore, as described above, by adopting a configuration in which the bottom surface of the high-resistance layer is flush with the interface between the n+-type semiconductor layer and the n--type semiconductor layer or is located below the interface between the n+-type semiconductor layer and the n--type semiconductor layer, it is possible to achieve further miniaturization of the semiconductor device. In addition, in an embodiment of the present disclosure, it is also preferable that the high-resistance layer has a first region located on the inside of the semiconductor device and a second region located on the outside of the semiconductor device, the distance between a bottom surface of the first region and the upper surface of the n+-type semiconductor layer is less than 1.5 μm, and a bottom surface of the second region is located above the bottom surface of the first region.

Figure 5:
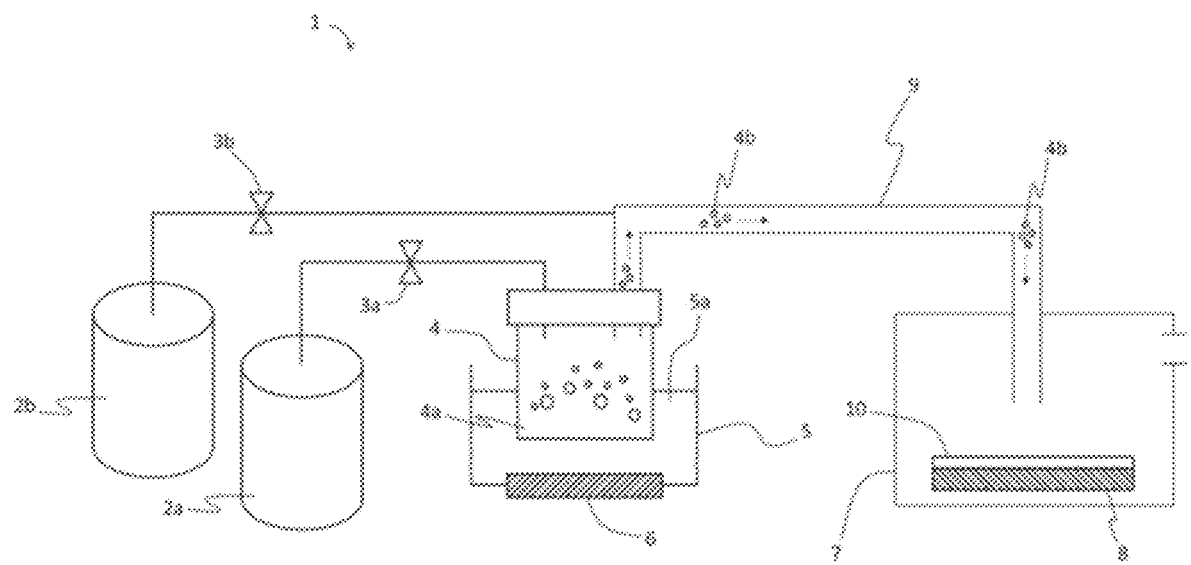
FIG. 5 is a configuration diagram of mist CVD equipment that is used in an embodiment of the present disclosure.

The n+-type semiconductor layer and the n--type semiconductor layer may be formed using a publicly known method. Examples of a method of forming the semiconductor layer include CVD, MOCVD, MOVPE, mist CVD, mist epitaxy, MBE, HVPE, a pulse growth method, ALD or the like. In an embodiment of the present disclosure, a method of forming the semiconductor layer is preferably MOCVD, mist CVD, mist epitaxy, or HVPE and more preferably mist CVD or mist epitaxy. In mist CVD or mist epitaxy described above, the semiconductor layer is formed using mist CVD equipment shown in FIG. 5, for example, by atomizing a raw material solution (an atomization process) to make droplets suspended, conveying the obtained atomized droplets to the space above a base by carrier gas (a conveying process) after atomization, and then stacking a semiconductor film containing a crystalline oxide semiconductor as a major component on the base by making the atomized droplets thermally react with each other near the base (a film formation process).

(Atomization Process)

The atomization process atomizes the raw material solution. A method of atomizing the raw material solution is not limited to a particular method as long as the method can atomize the raw material solution, and may be a publicly known method; in an embodiment of the present disclosure, an atomizing method using ultrasonic waves is preferable. The atomized droplets obtained using ultrasonic waves are preferable because the initial velocity thereof is zero, which allows them to be suspended in the air, and are very suitable because they are mist that is suspended in the space and can be conveyed as gas, not being sprayed like a spray, for example, and therefore cause no damage by collision energy. The droplet size is not limited to a particular size and may be a droplet of about a few mm; the droplet size is preferably 50 μm or less and more preferably 100 nm to 10 μm.

(Raw Material Solution)

The raw material solution is not limited to a particular raw material solution as long as the raw material solution can be atomized or turned into droplets and contains a raw material of which a semiconductor film can be formed, and may be an inorganic material or an organic material. In an embodiment of the present disclosure, the raw material is preferably metal or a metal compound and more preferably contains one or two or more types of metal selected from aluminum, gallium, indium, iron, chromium, vanadium, titanium, rhodium, nickel, cobalt, and iridium.

In an embodiment of the present disclosure, what is obtained by dissolving or dispersing the metal in an organic solvent or water in the form of a complex or salt can be suitably used as the raw material solution. Examples of the form of a complex include an acetylacetonato complex, a carbonyl complex, an ammine complex, and a hydrido complex. Examples of the form of salt include organometallic salt (for example, metallic acetate, metallic oxalate, and metallic citrate), metal sulfide salt, metal nitrate salt, metal phosphate salt, and metal halide salt (for example, metal chloride salt, metal bromide salt, and metal iodide salt).

Moreover, it is preferable to mix an additive such as halogen acid or oxidizer into the raw material solution. Examples of the halogen acid include hydrobromic acid, hydrochloric acid, and hydriodic acid, of which hydrobromic acid or hydriodic acid is preferable for the reason that it can curb the occurrence of an abnormal grain more efficiently. Examples of the oxidizer include peroxides such as hydrogen peroxide ($H_2O_2$), sodium peroxide ($Na_2O_2$), barium peroxide ($BaO_2$), and benzoyl peroxide ($(C_6H_5CO)_2O_2$), hypochlorous acid (HClO), perchloric acid, nitric acid, ozone water, and organic peroxides such as peroxyacetic acid and nitrobenzene.

The raw material solution may contain dopant. By making the raw material solution contain dopant, it is possible to perform doping satisfactorily. The dopant is not limited to particular dopant unless it interferes with the object of the present disclosure. Examples of the dopant include n-type dopant such as tin, germanium, silicon, titanium, zirconium, vanadium, or niobium, p-type dopant such as Mg, H, Li, Na, K, Rb, Cs, Fr, Be, Ca, Sr, Ba, Ra, Mn, Fe, Co, Ni, Pd, Cu, Ag, Au, Zn, Cd, Hg, Ti, Pb, N, or P, or the like. The content of the dopant is appropriately set by using a calibration curve indicating the relationship of the concentration of dopant in a raw material to a desired carrier density.

A solvent of the raw material solution is not limited to a particular solvent and may be an inorganic solvent such as water, an organic solvent such as alcohol, or a mixed solvent of an inorganic solvent and an organic solvent. In an embodiment of the present disclosure, the solvent preferably contains water and is more preferably water or a mixed solvent of water and alcohol.

(Conveying Process)

In the conveying process, the atomized droplets are conveyed into a film formation chamber by carrier gas. The carrier gas is not limited to particular carrier gas unless it interferes with the object of the present disclosure, and suitable examples of the carrier gas include oxygen, ozone, inert gas such as nitrogen and argon, reducing gas such as hydrogen gas and forming gas, or the like. Moreover, one type of carrier gas may be used; two or more types of carrier gas may be used and dilution gas (for example, 10-fold dilution gas) with a decreased flow rate, for example, may be additionally used as second carrier gas. Furthermore, instead of one carrier gas supply point, two or more carrier gas supply points may be provided. The flow rate of carrier gas is not limited to a particular flow rate and is preferably 0.01 to 20 L/min and more preferably 1 to 10 L/min. When dilution gas is used, the flow rate of the dilution gas is preferably 0.001 to 2 L/min and more preferably 0.1 to 1 L/min.

(Film Formation Process)

In the film formation process, the semiconductor film is formed on a base by making the atomized droplets thermally react with each other near the base. A thermal reaction only has to make the atomized droplets react with each other by heat, and the reaction conditions and so forth are also not limited to particular reaction conditions and so forth unless they interfere with the object of the present disclosure. In this process, the thermal reaction is generally carried out at a temperature equal to or higher than the evaporation temperature of a solvent; the temperature is preferably not too high temperatures (for example, 1000° C.) or lower, more preferably 650° C. or lower, and most preferably 300 to 650° C. Moreover, the thermal reaction may be carried out under any one of the following atmospheres: under vacuum, under a non-oxygen atmosphere (for example, under an inert gas atmosphere), under a reducing gas atmosphere, and under an oxygen atmosphere unless it interferes with the object of the present disclosure; it is preferable that the thermal reaction is carried out under an inert gas atmosphere or under an oxygen atmosphere. Furthermore, the thermal reaction may be carried out under any one of the following conditions: under atmospheric pressure, under increased pressure, and under reduced pressure; in an embodiment of the present disclosure, it is preferable that the thermal reaction is carried out under atmospheric pressure. It is to be noted that a film thickness may be set by adjusting the film formation time.

(Base)

The base is not limited to a particular base as long as the base can support the semiconductor film. A material for the base is also not limited to a particular material unless it interferes with the object of the present disclosure and the base may be a publicly known base, and the material for the base may be an organic compound or an inorganic compound. The base may have any shape and is effective for any shape, and examples of the shape thereof include a plate-like shape such as a flat plate-like shape or a disk-like shape, a fiber-like shape, a rod-like shape, a columnar shape, a prismatic shape, a tubular shape, a spiral shape, a spherical shape, and a ring-like shape; in an embodiment of the present disclosure, a substrate is preferable. The thickness of a substrate is not limited to a particular thickness in an embodiment of the present disclosure.

The substrate is not limited to a particular substrate as long as the substrate is a plate-like substrate and serves as a support of the semiconductor film. The substrate may be an insulator substrate, a semiconductor substrate, a metal substrate, or a conductive substrate; it is preferable that the substrate is an insulator substrate and it is also preferable that the substrate is a substrate having a metal film on the front surface thereof. Examples of the substrate include an underlying substrate containing a substrate material with a corundum structure as a major component, an underlying substrate containing a substrate material with a β-gallia structure as a major component, an underlying substrate containing a substrate material with a hexagonal structure as a major component, or the like. A "major component" here means that a substrate material with the above-described particular crystal structure constitutes preferably 50% or more, more preferably 70% or more, and further preferably 90% or more of all the components of a substrate material in terms of atom ratio, and a substrate material with the above-described particular crystal structure may constitute 100% of all the components of a substrate material in terms of atom ratio.

A substrate material is not limited to a particular substrate material unless it interferes with the object of the present disclosure, and may be a publicly known substrate material. Suitable examples of the substrate material with a corundum structure include α-$Al_2O_3$ (a sapphire substrate), α-$Ga_2O_3$ or the like, and more suitable examples include an a-plane sapphire substrate, an m-plane sapphire substrate, an r-plane sapphire substrate, a c-plane sapphire substrate, and an α-type gallium oxide substrate (a-plane, m-plane, or r-plane). Examples of an underlying substrate whose major component is a substrate material with a β-gallia structure include a β-$Ga_2O_3$ substrate, a mixed crystal substrate containing $Ga_2O_3$ and $Al_2O_3$, the content of $Al_2O_3$ being more than 0 wt % and 60 wt % or less, or the like. Moreover, examples of an underlying substrate whose major component is a substrate material with a hexagonal structure include a SiC substrate, a ZnO substrate, and a GaN substrate.

In an embodiment of the present disclosure, annealing treatment may be performed after the film formation process. The annealing treatment temperature is not limited to a particular temperature unless it interferes with the object of the present disclosure, and the annealing treatment temperature is generally 300 to 650° C. and preferably 350 to 550° C. Moreover, the annealing treatment time is generally 1 minute to 48 hours, preferably 10 minutes to 24 hours, and more preferably 30 minutes to 12 hours. It is to be noted that the annealing treatment may be carried out under any atmosphere unless it interferes with the object of the present disclosure. The annealing treatment may be carried out under a non-oxygen atmosphere or under an oxygen atmosphere. Examples of the annealing treatment that is carried out under a non-oxygen atmosphere include annealing treatment that is carried out under an inert gas atmosphere (for example, under a nitrogen atmosphere), annealing treatment that is carried out under a reducing gas atmosphere, or the like; in an embodiment of the present disclosure, the annealing treatment is carried out preferably under an inert gas atmosphere and more preferably under a nitrogen atmosphere.

Moreover, in an embodiment of the present disclosure, the semiconductor film may be provided directly on the base or may be provided on the base with another layer, such as a stress relaxation layer (for example, a buffer layer or an ELO layer) or a separation sacrifice layer, placed therebetween. A method of forming each layer is not limited to a particular method and may be a publicly known method; in an embodiment of the present disclosure, mist CVD is preferable.

In an embodiment of the present disclosure, the semiconductor film may be used in a semiconductor device as the semiconductor layer after using a publicly known method such as separating the semiconductor film from the base or the like, or the semiconductor film may be used as it is in a semiconductor device as the semiconductor layer.

The Schottky electrode is not limited to a particular Schottky electrode as long as it can form a Schottky junction with the n--type semiconductor layer. A constituent material for the Schottky electrode may be a conductive inorganic material or a conductive organic material. In an embodiment of the present disclosure, it is preferable that a constituent material for the Schottky electrode is metal. Suitable examples of the metal include at least one type of metal selected from groups 4 to 10 of the periodic table. Examples of metals of group 4 of the periodic table include titanium (Ti), zirconium (Zr), and hafnium (Hf). Examples of metals of group 5 of the periodic table include vanadium (V), niobium (Nb), and tantalum (Ta). Examples of metals of group 6 of the periodic table include chromium (Cr), molybdenum (Mo), and tungsten (W). Examples of metals of group 7 of the periodic table include manganese (Mn), technetium (Tc), and rhenium (Re). Examples of metals of group 8 of the periodic table include iron (Fe), ruthenium (Ru), and osmium (Os). Examples of metals of group 9 of the periodic table include cobalt (Co), rhodium (Rh), and iridium (Ir). Examples of metals of group 10 of the periodic table include nickel (Ni), palladium (Pd), and platinum (Pt). The thickness of the Schottky electrode is not limited to a particular thickness; the thickness of the Schottky electrode is preferably 0.1 nm to 10 more preferably 5 to 500 nm, and most preferably 10 to 200 nm. In an embodiment of the present disclosure, the Schottky electrode may include a first electrode layer provided on the n--type semiconductor layer and a second electrode layer provided on the first electrode layer. It is to be noted that, in an embodiment of the present disclosure, it is preferable that the layer thickness of the first electrode layer is smaller than the layer thickness of the second electrode layer. Moreover, in an embodiment of the present disclosure, it is preferable that the work function of the first electrode layer is greater than the work function of the second electrode layer. This preferred configuration of the first electrode layer makes it possible not only to obtain a semiconductor device with better Schottky characteristics but also to enhance the effect of increasing a reverse breakdown voltage. Furthermore, in an embodiment of the present disclosure, the Schottky electrode may be configured with a single layer or configured with two or more metal layers.

A method of forming the Schottky electrode is not limited to a particular method and may be a publicly known method. Specific examples of a method of forming the Schottky electrode include a dry process and a wet process. Examples of the dry process include sputtering, vacuum evaporation, and CVD and the like. Examples of the wet process include screen printing and die coating.

Figure 17:
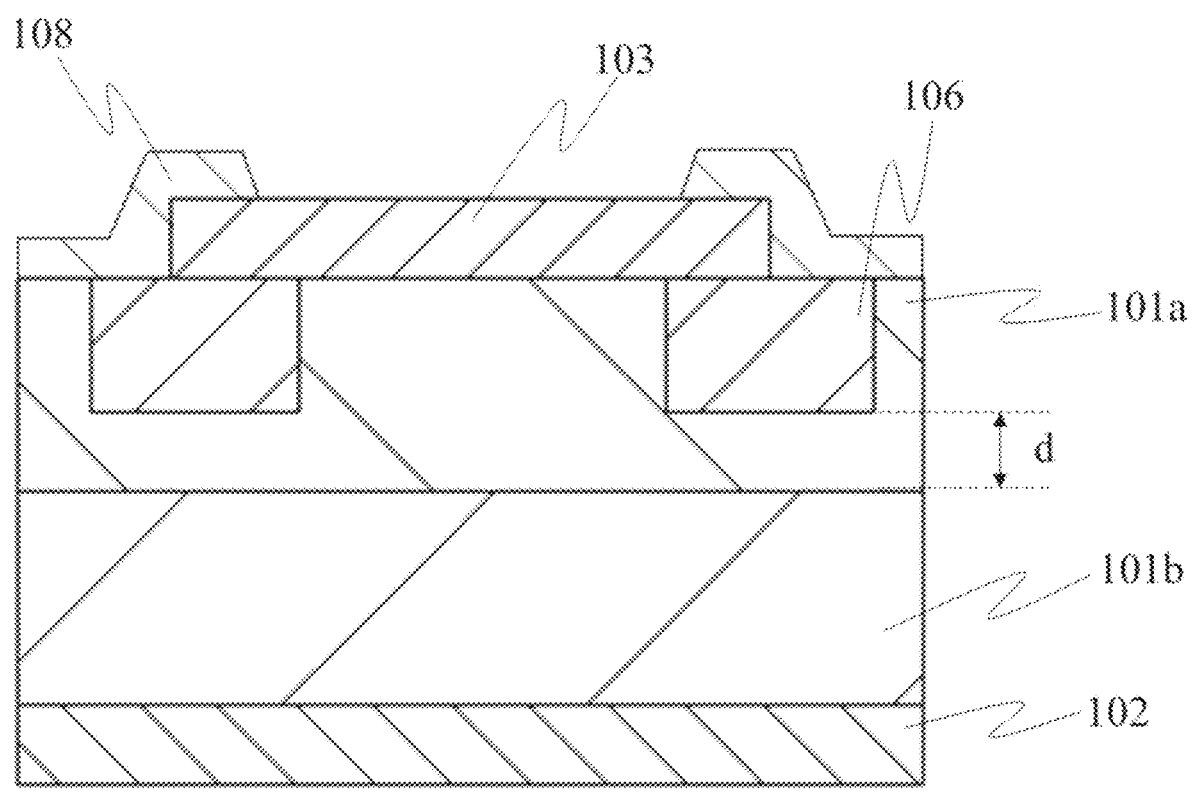
FIG. 17 is a diagram schematically showing a Schottky barrier diode (SBD) according to another embodiment of the present disclosure.

In an embodiment of the present disclosure, it is preferable that the semiconductor device further includes an insulator layer that is formed on the n--type semiconductor layer and the edge of the Schottky electrode is located on the insulator layer. A constituent material for the insulator layer is not limited to a particular constituent material unless it interferes with the object of the present disclosure, and may be a publicly known material. Examples of the insulator layer include a $SiO_2$ film, a phosphorus-doped $SiO_2$ film (a PSG film), a boron-doped $SiO_2$ film, and a phosphorus- and boron-doped $SiO_2$ film (a BPSG film). Examples of a method of forming the insulator layer include CVD, atmospheric pressure CVD, plasma CVD, and mist CVD and the like. In an embodiment of the present disclosure, a method of forming the insulator layer is preferably mist CVD or atmospheric pressure CVD. Moreover, in an embodiment of the present disclosure, it is preferable that, as shown in FIG. 17, a passivation film covering the outer edge of the Schottky electrode and at least a part of a surface of the n--type semiconductor layer is formed in the semiconductor device. This preferred configuration makes it possible to suppress a leakage current of the semiconductor device in a more satisfactory manner. A constituent material for the passivation film and a method of forming the passivation film may be the same as the constituent material for the insulator layer and the method of forming the insulator layer.

The semiconductor device of the present disclosure is useful for various semiconductor elements and useful for a power device in particular. Moreover, the semiconductor elements can be classified into two types: a horizontal element (a horizontal device) in which an electrode is formed on one side of a semiconductor layer and a current flows in a film thickness direction of the semiconductor layer and an in-plane direction of a film plane and a vertical element (a vertical device) in which an electrode is provided on both sides of a semiconductor layer and a current flows in a film thickness direction of the semiconductor layer. In an embodiment of the present disclosure, the semiconductor device may be suitably used in both the horizontal device and the vertical device; it is preferable to use the semiconductor device in the vertical device in particular. Examples of the semiconductor elements include a Schottky barrier diode (SBD), a junction barrier Schottky (JBS) diode, a metal semiconductor field-effect transistor (MESFET), a metal-insulator-semiconductor field-effect transistor (MISFET), a metal-oxide-semiconductor field-effect transistor (MOSFET), a high-electron-mobility transistor (HEMT), a light-emitting diode, or the like. In an embodiment of the present disclosure, the semiconductor device is preferably a diode and more preferably a Schottky barrier diode (SBD).

Hereinafter, suitable examples of the semiconductor device will be described using the drawings; the present disclosure is not limited to these embodiments. It is to be noted that a semiconductor device which will be illustrated below may include another layer (for example, an insulator layer, a semi-insulator layer, a conductor layer, a semiconductor layer, a buffer layer, or other intermediate layers) and the like or a buffer layer or the like may be omitted therefrom as appropriate unless it interferes with the object of the present disclosure.

FIG. 1 shows principal portions of a Schottky barrier diode (SBD) which is one of suitable embodiments of the present disclosure. The SBD of FIG. 1 includes an ohmic electrode 102, an n+-type semiconductor layer 101b, an n--type semiconductor layer 101a, a high-resistance layer 106, and a Schottky electrode 103. In the semiconductor device of FIG. 1, the distance d between a bottom surface of the high-resistance layer 106 and an upper surface of the n+-type semiconductor layer 101b is less than 1.5 μm. This configuration makes it possible to satisfactorily reduce a leakage current of the semiconductor device. Moreover, in the embodiment of the present disclosure, it is also preferable that at least a part of a side surface of the high-resistance layer 106 has a tapered shape in which the thickness thereof decreases from the side where the Schottky electrode 103 is located toward the side where the ohmic electrode 102 is located. This preferred structure makes it possible to reduce electric field concentration on the surface in a more satisfactory manner. Furthermore, examples of a constituent material for the Schottky electrode 103 and/or the ohmic electrode 102 include the aforementioned metal described by way of example as the constituent material for the Schottky electrode and the like. A method of forming each layer of FIG. 1 is not limited to a particular method unless it interferes with the object of the present disclosure, and may be a publicly known method. Examples of a method of forming each layer of FIG. 1 include a method of performing patterning by photolithography after forming a film by a vacuum evaporation method, CVD, sputtering, or various coating technologies, a method of directly performing patterning using a printing technique or the like after forming a film by a vacuum evaporation method, CVD, sputtering, or various coating technologies, or the like.

Figure 6:
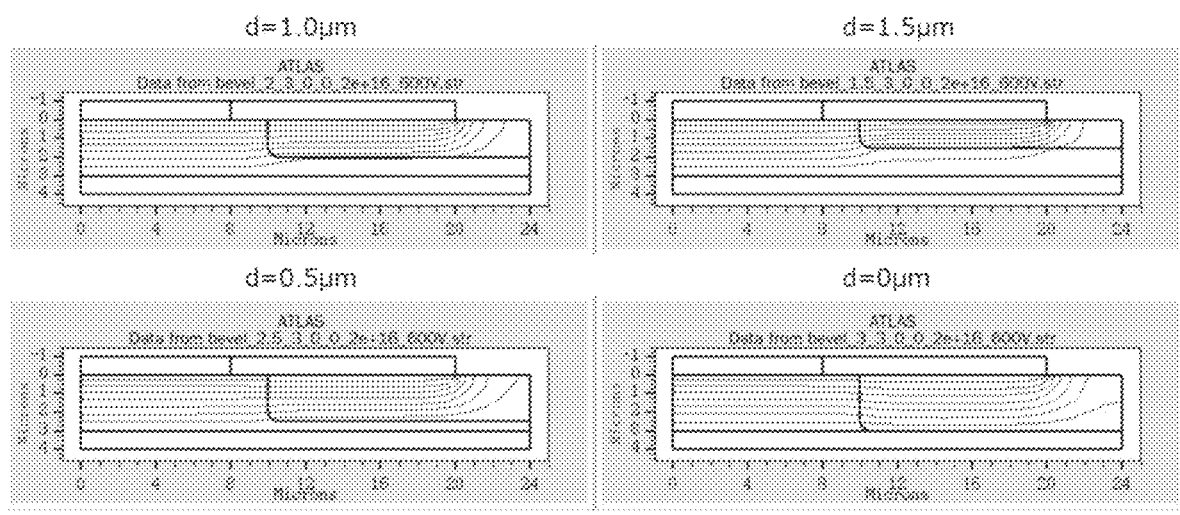
FIG. 6 is a diagram showing the simulation results in an embodiment and a comparative example.
Figure 7:
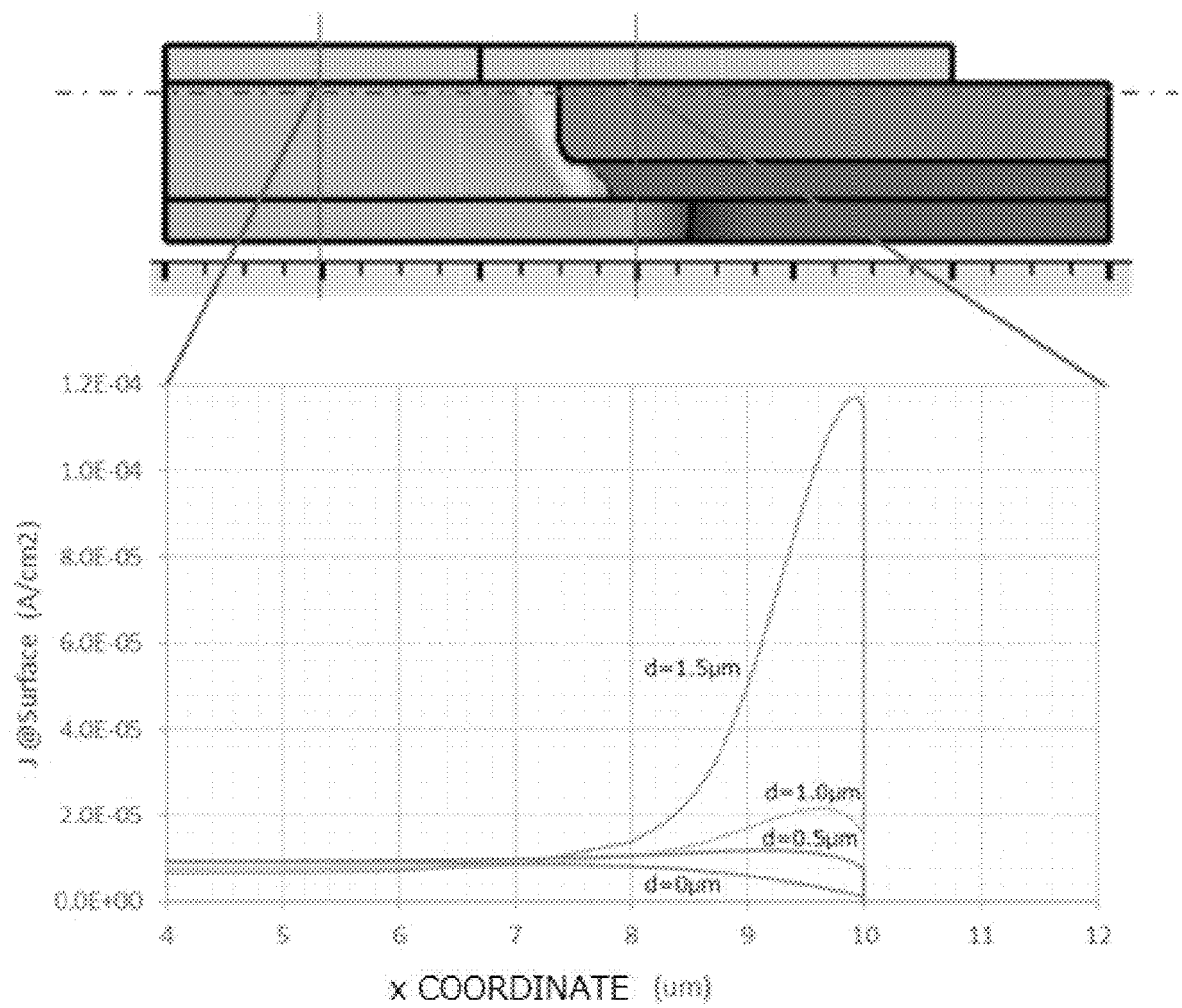
FIG. 7 is a diagram showing the simulation results in an embodiment and the comparative example.

In order to confirm the effect obtained by the embodiment of the present disclosure, a simulation was performed by simulating the semiconductor device shown in FIG. 1. A simulation was performed on the assumption that α-$Ga_2O_3$ was used as an n+-type semiconductor layer and an n--type semiconductor layer and $SiO_2$ was used as a high-resistance layer. FIG. 6 shows the simulation results (a reverse voltage: 600 V) (equipotential lines are shown by thin lines with an interval of 60 V) of the potential distribution observed when the distance d between a bottom surface of the high-resistance layer and an upper surface of the n+-type semiconductor layer was 1.5 μm, the distance d was 1.0 μm, the distance d was 0.5 μm, and the distance d was 0 μm. FIG. 7 shows the simulation results of the current density observed when the distance d between the bottom surface of the high-resistance layer and the upper surface of the n+-type semiconductor layer was 1.5 μm, the distance d was 1.0 μm, the distance d was 0.5 μm, and the distance d was 0 μm. As is clear from FIGS. 6 and 7, the current density in the Schottky electrode and at the edge of the high-resistance layer is significantly reduced when the distance d is less than 1.5 μm. Moreover, the results reveal that, when the distance d is 1.0 μm or less, the distance d set at 0.5 μm or less may further enhance the leakage current reduction effect.

It is to be noted that Table 1 shows calculation and comparison results of a defect current which is generated due to a defect at the interface between a side surface of the high-resistance layer and a side surface of the n--type semiconductor layer when gallium oxide is used as the n--type semiconductor layer and when SiC or GaN is used as the n--type semiconductor layer. Based on the assumption that a current generated by a defect in a depletion layer on a side surface is proportional to the intrinsic carrier density, the current was determined from the ratio of the intrinsic carrier density with consideration given to the band gap of each material. It is to be noted that each numerical value of Table 1 indicates the magnitude of a defect current relative to the magnitude of a defect current, which is assumed to be 1, observed when 4H—SiC was used as the n--type semiconductor layer. As is clear from Table 1, when gallium oxide is used as the n--type semiconductor layer, a defect current which is generated due to a defect at the interface between the side surface of the high-resistance layer and the side surface of the n--type semiconductor layer is significantly reduced as compared with a case where SiC or GaN is used as the n--type semiconductor layer. That is, a structure, like that shown in FIG. 1, with a high-resistance layer embedded in an n--type semiconductor layer is more suitable for a semiconductor device using gallium oxide in particular. Moreover, when α-$Ga_2O_3$ is used as the n--type semiconductor layer, a leakage current which is generated due to a defect at the interface is further reduced as compared with a case where β-$Ga_2O_3$ is used as the n--type semiconductor layer.

TABLE 1

| | 4H-SiC | GaN | β-$Ga_2O_3$ | α-$Ga_2O_3$ |
| --- | --- | --- | --- | --- |
| Room Temperature (300K) | 1 | $4 \times 10^{-2}$ | $2 \times 10^{-12}$ | $3 \times 10^{-19}$ |
| 443K | 1 | $1 \times 10^{-1}$ | $3 \times 10^{-9}$ | $8 \times 10^{-14}$ |

*Each numerical value indicates the magnitude of a defect current relative to the magnitude of a defect current, which is assumed to be 1, observed when 4H-SiC was used as the n--type semiconductor layer.

Hereinafter, the present disclosure will be described in more detail using a suitable example in which the semiconductor device of FIG. 1 is produced.

Figure 2:
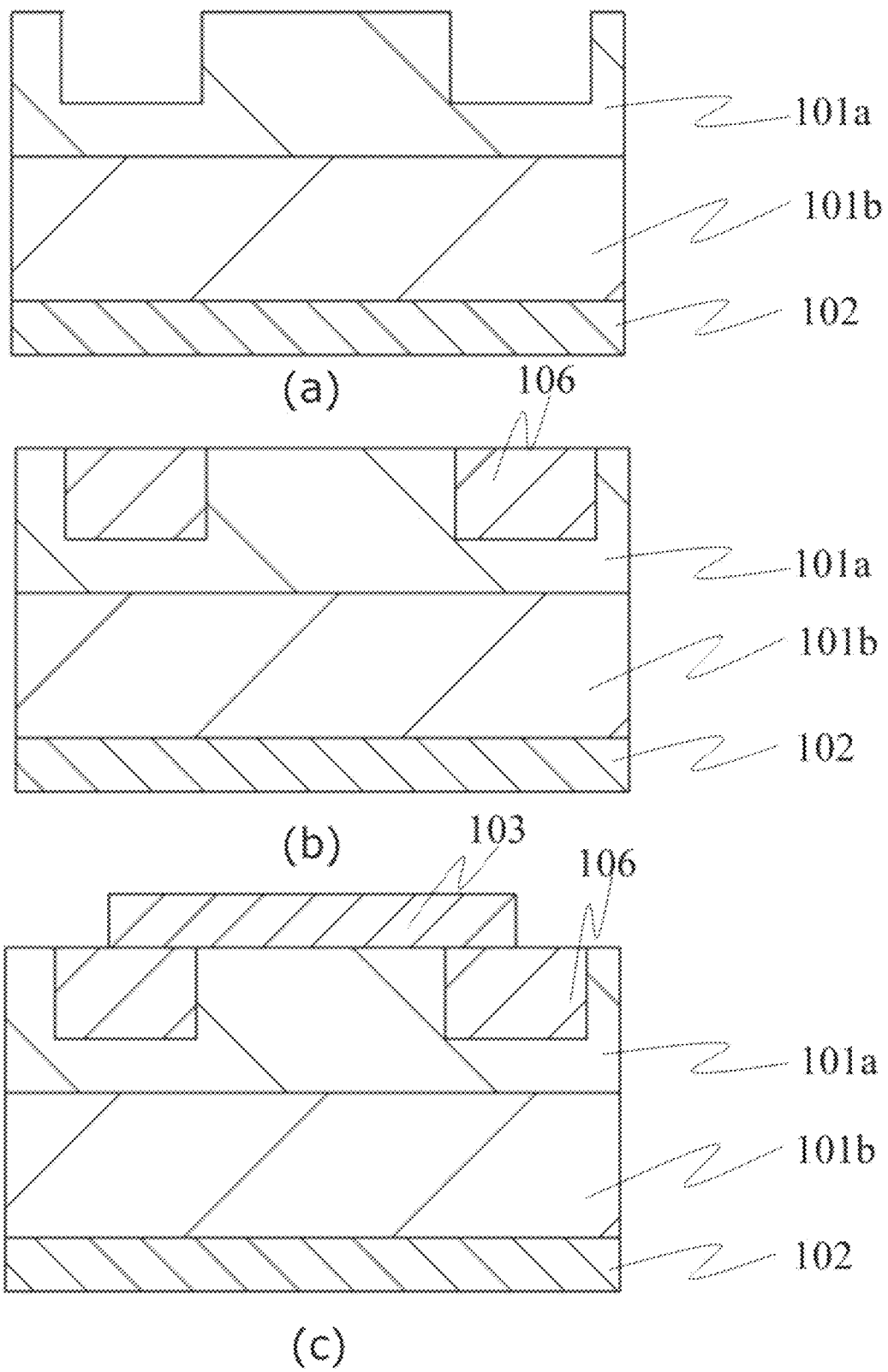
FIGS. 2A to 2C are diagrams schematically showing suitable processes of producing the Schottky barrier diode (SBD) according to an embodiment of the present disclosure.

FIG. 2A shows a multilayer body in which an n+-type semiconductor layer 101b and an n--type semiconductor layer 101a are formed in this order on an ohmic electrode 102 and a trench is formed in the n--type semiconductor layer 101a. The trench is formed using a publicly known etching method or the like. At the time of the formation of the trench, the trench is formed in such a way that the distance between a bottom surface of the trench and an upper surface of the n+-type semiconductor layer 101b is less than 1.5 μm. Next, a high-resistance layer 106 is formed on the multilayer body of FIG. 2A, whereby a multilayer body of FIG. 2B is obtained. After the formation of the high-resistance layer 106, the front surface of the n--type semiconductor layer 101a and/or the high-resistance layer 106 may be polished using CMP or the like. It is to be noted that examples of a method of forming the high-resistance layer 106 include sputtering, a vacuum evaporation method, a coating method, CVD, atmospheric pressure CVD, plasma CVD, and mist CVD and the like. Then, a Schottky electrode 103 is formed on the multilayer body of FIG. 2B using the dry process or the wet process and photolithography, whereby a multilayer body of FIG. 2C is obtained. In the semiconductor device obtained in the above-described manner, the distance between a bottom surface of the high-resistance layer 106 and an upper surface of the n--type semiconductor layer 101a is less than 1.5 µm. This configuration makes it possible to satisfactorily reduce a leakage current of the semiconductor device.

Figure 3:
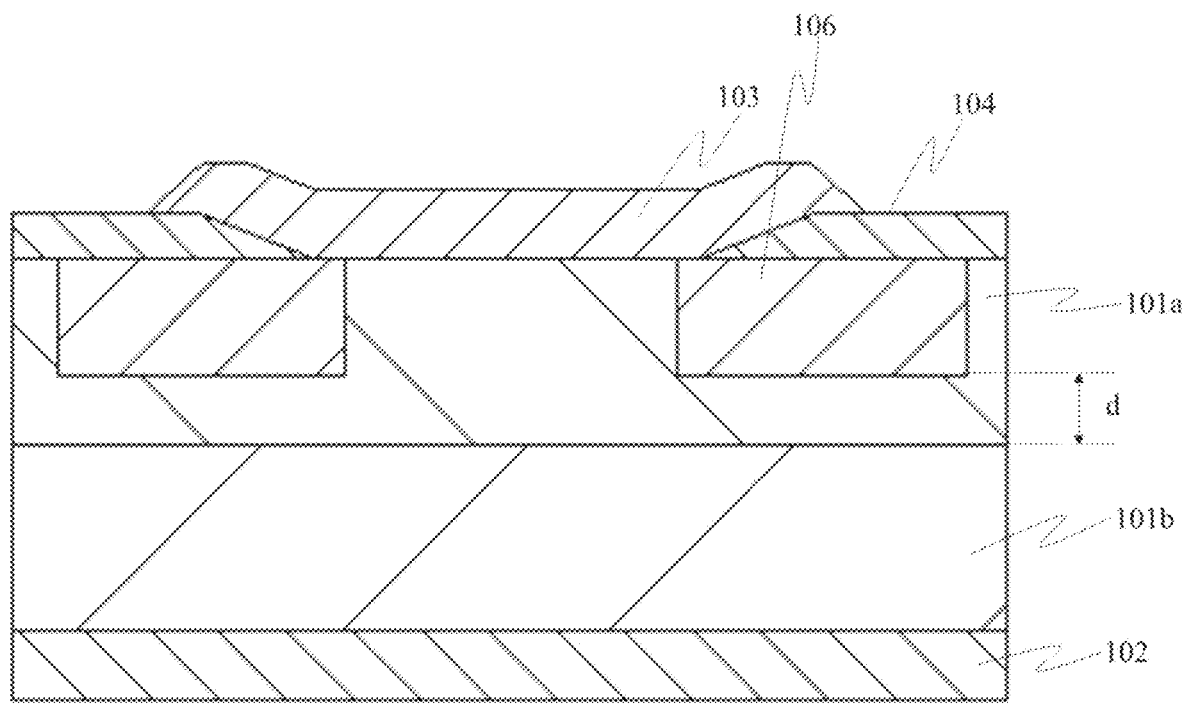
FIG. 3 is a diagram schematically showing a Schottky barrier diode (SBD) according to an embodiment of the present disclosure.

FIG. 3 shows principal portions of a Schottky barrier diode (SBD) which is one of other suitable embodiments of the present disclosure. The SBD of FIG. 3 is different from the SBD of FIG. 1 in that the SBD of FIG. 3 further includes an insulator layer 104 and the edge of a Schottky electrode 103 is located on the insulator layer 104. This configuration allows the semiconductor device to have better withstand voltage characteristics. A method of forming each layer of FIG. 3 is not limited to a particular method unless it interferes with the object of the present disclosure, and may be a publicly known method. Examples of a method of forming each layer of FIG. 3 include a method of performing patterning by photolithography after forming a film by a vacuum evaporation method, CVD, sputtering, or various coating technologies, a method of directly performing patterning using a printing technique or the like after forming a film by a vacuum evaporation method, CVD, sputtering, or various coating technologies, or the like.

Figure 4:
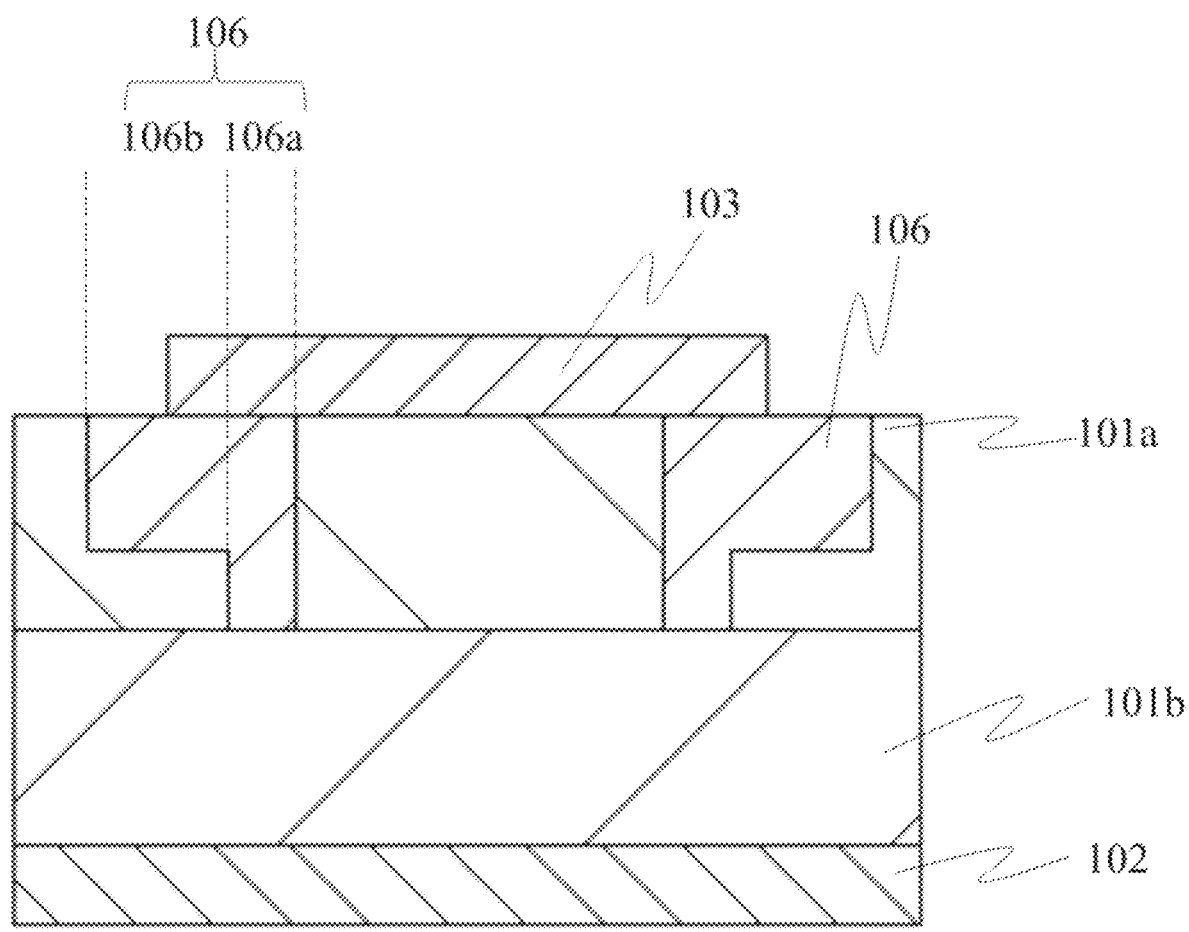
FIG. 4 is a diagram schematically showing a Schottky barrier diode (SBD) according to an embodiment of the present disclosure.

FIG. 4 shows principal portions of a Schottky barrier diode (SBD) which is one of the other suitable embodiments of the present disclosure. The SBD of FIG. 4 is different from the SBD of FIG. 1 in that a high-resistance layer 106 has a first region 106a located on the inside of the semiconductor device and a second region 106b located on the outside of the semiconductor device, the distance between a bottom surface of the first region 106a and an upper surface of the n+-type semiconductor layer 101b is less than 1.5 µm (the distance is 0 in FIG. 4), and a bottom surface of the second region 106b is located above the bottom surface of the first region 106a. A method of forming each layer of FIG. 4 is not limited to a particular method unless it interferes with the object of the present disclosure, and may be a publicly known method. Examples of a method of forming each layer of FIG. 4 include a method of performing patterning by photolithography after forming a film by a vacuum evaporation method, CVD, sputtering, or various coating technologies, a method of directly performing patterning using a printing technique or the like after forming a film by a vacuum evaporation method, CVD, sputtering, or various coating technologies, or the like.

Figure 12:
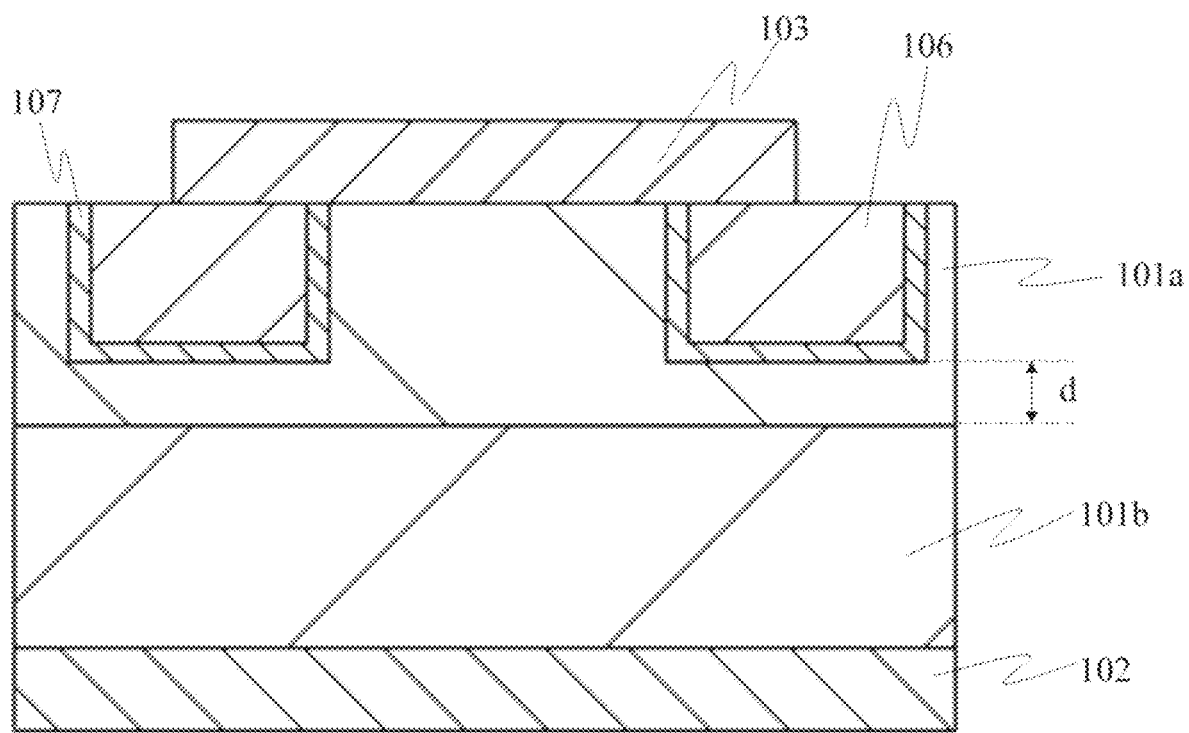
FIG. 12 is a diagram schematically showing a Schottky barrier diode (SBD) according to an embodiment of the present disclosure.

FIG. 12 shows principal portions of a Schottky barrier diode (SBD) which is one of the other suitable embodiments of the present disclosure. The SBD of FIG. 12 is different from the SBD of FIG. 1 in that a high-resistance layer 107 is formed between a high-resistance layer 106 and an n--type semiconductor layer 101a. It is to be noted that, in the SBD of FIG. 12, a high-resistance layer obtained by doping an oxide semiconductor with impurities, for example, is used as the high-resistance layer 106. This oxide semiconductor is an epitaxial film formed based on the crystal structure of the n--type semiconductor layer 101a. This configuration makes it possible to reduce a defect which is likely to appear at the interface between a high-resistance layer and an n--type semiconductor layer and thereby achieve a higher-withstand-voltage semiconductor device. A method of forming each layer of FIG. 12 other than the high-resistance layer 107 is not limited to a particular methods unless it interferes with the object of the present disclosure, and may be a publicly known method. Examples of a method of forming each layer of FIG. 12 other than the high-resistance layer 107 include a method of performing patterning by photolithography after forming a film by a vacuum evaporation method, CVD, sputtering, or various coating technologies, a method of directly performing patterning using a printing technique or the like after forming a film by a vacuum evaporation method, CVD, sputtering, or various coating technologies, or the like.

Moreover, FIG. 17 shows principal portions of a Schottky barrier diode (SBD) which is one of the other suitable embodiments of the present disclosure. The SBD of FIG. 17 is different from the SBD of FIG. 1 in that the SBD of FIG. 17 includes a passivation film 108 covering at least a part of an n--type semiconductor layer 101a and an outer edge of a Schottky electrode 103. This preferred configuration makes it possible to further reduce a leakage current at the time of application of a reverse voltage. It is to be noted that, in the embodiment of the present disclosure, when viewed in a plan view, the passivation film 108 preferably covers at least a part of a high-resistance layer 106 and more preferably covers the outer edge of the high-resistance layer 106. Also, according to an embodiment of the present disclosure, the passivation film 108 preferably covers the surface of the semiconductor layer 101a, up to an outer edge of the semiconductor layer 101a, in plan view.

The semiconductor device is especially useful for a power device. Examples of the semiconductor device include diodes (for example, a PN diode, a Schottky barrier diode, and a junction barrier Schottky diode), transistors (for example, a MOSFET and a MESFET) or the like.

Figure 8:
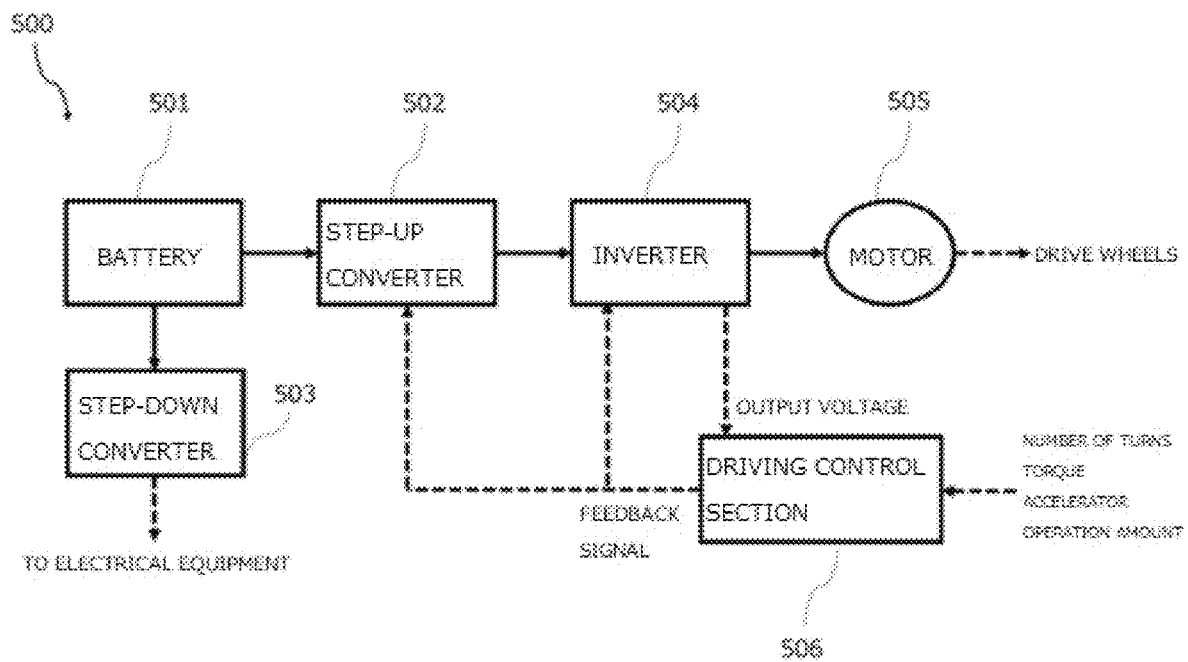
FIG. 8 is a block configuration diagram showing one example of a control system adopting the semiconductor device according to an embodiment of the present disclosure.
Figure 9:
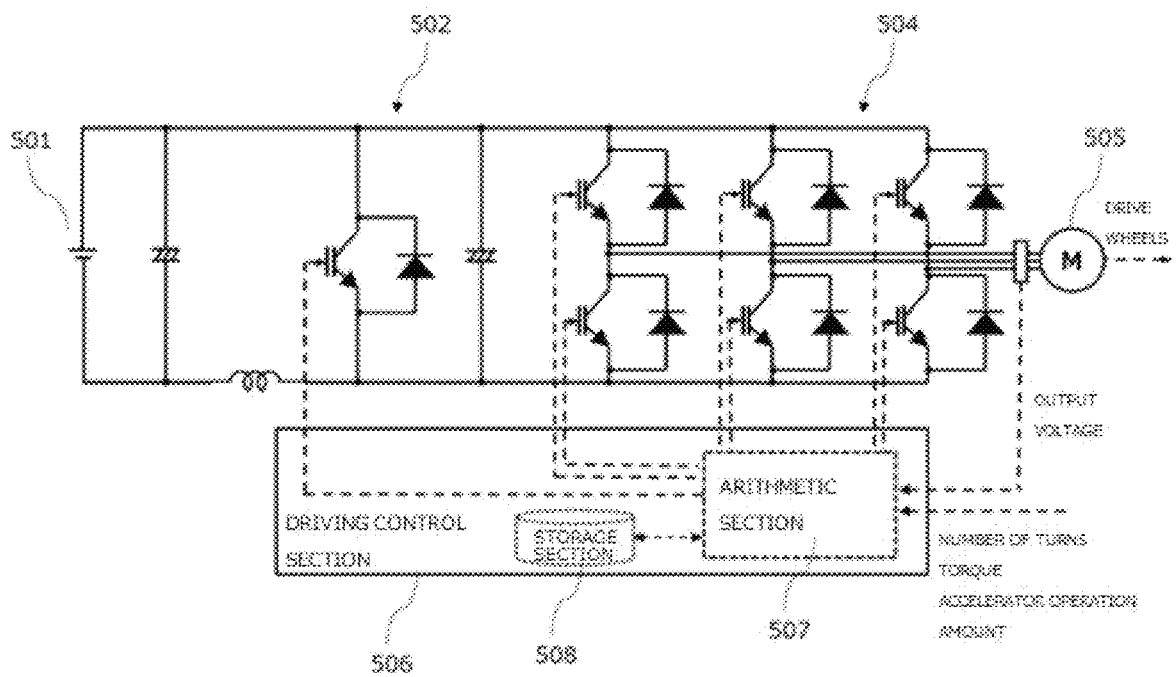
FIG. 9 is a circuit diagram showing one example of the control system adopting the semiconductor device according to an embodiment of the present disclosure.

The above-described semiconductor device according to the embodiment of the present disclosure may be applied to power converters such as an inverter and a converter to make the most of the aforementioned function thereof. More specifically, the above-described semiconductor device according to the embodiment of the present disclosure may be used as a diode built into an inverter and a converter, a thyristor, a power transistor, an insulated gate bipolar transistor (IGBT), and a metal-oxide-semiconductor field-effect transistor (MOSFET) which are switching elements, and the like. FIG. 8 is a block configuration diagram showing one example of a control system using the semiconductor device according to the embodiment of the present disclosure and FIG. 9 is a circuit diagram of the control system, which is particularly suitable for installation in an electric vehicle.

As shown in FIG. 8, a control system 500 includes a battery (a power supply) 501, a step-up converter 502, a step-down converter 503, an inverter 504, a motor (an object to be driven) 505, and a driving control section 506, which are installed in an electric vehicle. The battery 501 is configured with a storage battery such as a nickel metal hydride battery or a lithium-ion battery, and may store power by charging at a feeding station or regenerative energy during deceleration, for example, and output a direct-current voltage that is necessary for operation of a traveling system and an electrical component system of the electric vehicle. The step-up converter 502 is a voltage converter with a chopper circuit, for example, and may step up a direct-current voltage of 200 V, for example, which is supplied from the battery 501 to 650 V, for example, by switching operation of the chopper circuit and output the voltage to the traveling system such as a motor. The step-down converter 503 is a voltage converter with a chopper circuit as in the case of the step-up converter 502 and may step down a direct-current voltage of 200 V, for example, which is supplied from the battery 501 to about 12 V, for example, and output the voltage to the electrical component system including a power window, a power steering, an in-vehicle electrical device or the like.

The inverter 504 converts the direct-current voltage that is supplied from the step-up converter 502 into a three-phase alternating-current voltage by switching operation and outputs the three-phase alternating-current voltage to the motor 505. The motor 505 is a three-phase alternating-current motor that constitutes the traveling system of the electric vehicle; the motor 505 is driven and rotated by the three-phase alternating-current voltage that is output from the inverter 504, and transmits the rotary drive force to wheels of the electric vehicle via an unillustrated transmission or the like.

On the other hand, measured values such as the number of turns of the wheel, torque, and the amount of depression of an accelerator pedal (the accelerator operation amount) are measured from the traveling electric vehicle using unillustrated various kinds of sensors, and these measurement signals are input to the driving control section 506. At the same time, the output voltage value of the inverter 504 is also input to the driving control section 506. The driving control section 506 has the function of a controller provided with an arithmetic section such as a central processing unit (CPU) and a data storage section such as memory and controls the switching operation performed by the switching elements by generating a control signal using the input measurement signals and outputting the control signal to the inverter 504 as a feedback signal. This allows the alternating-current voltage that is supplied to the motor 505 by the inverter 504 to be instantaneously corrected, which makes it possible to achieve precise operation control of the electric vehicle, whereby safe and comfortable operation of the electric vehicle is achieved. It is to be noted that the output voltage to the inverter 504 may also be controlled by providing the feedback signal from the driving control section 506 to the step-up converter 502.

FIG. 9 is a circuit configuration obtained by removing the step-down converter 503 from FIG. 8, that is, a circuit configuration showing only a configuration for driving the motor 505. As shown in FIG. 9, the semiconductor device of the present disclosure is used for switching control by being adopted in the step-up converter 502 and the inverter 504 as a Schottky barrier diode, for example. In the step-up converter 502, the semiconductor device of the present disclosure is integrated into the chopper circuit and performs chopper control; in the inverter 504, the semiconductor device of the present disclosure is integrated into a switching circuit including an IGBT and performs switching control. It is to be noted that the output of the battery 501 is made to pass through an inductor (such as a coil) for stabilization of a current and a capacitor (such as an electrolytic capacitor) is provided between the battery 501 and the step-up converter 502 and between the step-up converter 502 and the inverter 504 for stabilization of a voltage.

Moreover, as shown by dotted lines in FIG. 9, an arithmetic section 507 configured with a central processing unit (CPU) and a storage section 508 configured with nonvolatile memory are provided in the driving control section 506. The signal input to the driving control section 506 is provided to the arithmetic section 507 and a necessary arithmetic operation is performed, whereby a feedback signal for each semiconductor element is generated. Furthermore, the storage section 508 temporarily holds the arithmetic operation result obtained by the arithmetic section 507, and stores a physical constant, a function and the like, which are necessary for drive control, in the form of a table and outputs them to the arithmetic section 507 as appropriate. A publicly known configuration may be adopted as the arithmetic section 507 and the storage section 508, and their processing capabilities and so forth may also be arbitrarily selected.

As shown in FIGS. 8 and 9, in the control system 500, a diode and a thyristor, a power transistor, an IGBT, and a MOSFET, which are switching elements, and the like are used for switching operation that is performed in the step-up converter 502, the step-down converter 503, and the inverter 504. By using gallium oxide ($Ga_2O_3$), in particular, corundum-type gallium oxide ($\alpha$-$Ga_2O_3$) in these semiconductor elements as a material therefor, the switching characteristics are significantly improved. In addition, by applying the semiconductor device or the like according to the present disclosure to these semiconductor elements, it is expected that extremely good switching characteristics will be achieved and it is possible to achieve further miniaturization of the control system 500 and cost reduction. That is, it is expected that each of the step-up converter 502, the step-down converter 503, and the inverter 504 will benefit from the effects of the present disclosure, and it is expected that any one of the step-up converter 502, the step-down converter 503, and the inverter 504, any combination of two or more of the step-up converter 502, the step-down converter 503, and the inverter 504, and a configuration including the driving control section 506 in addition to them will benefit from the effects of the present disclosure.

It is to be noted that the above-described control system 500 may apply the semiconductor device of the present disclosure not only to a control system of an electric vehicle, but also to control systems for all uses, such as stepping up or down power from a direct-current power supply and performing power conversion from a direct current to an alternating current. Moreover, a power supply such as a solar cell may also be used as a battery.

Figure 10:
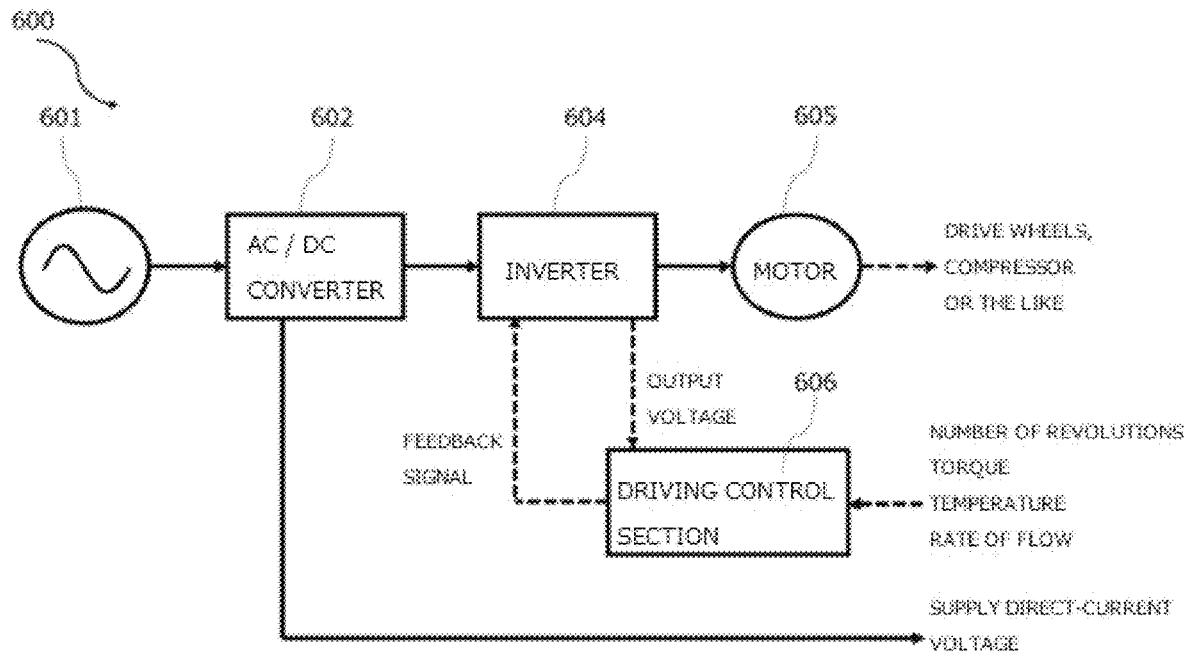
FIG. 10 is a block configuration diagram showing one example of a control system adopting the semiconductor device according to an embodiment of the present disclosure.
Figure 11:
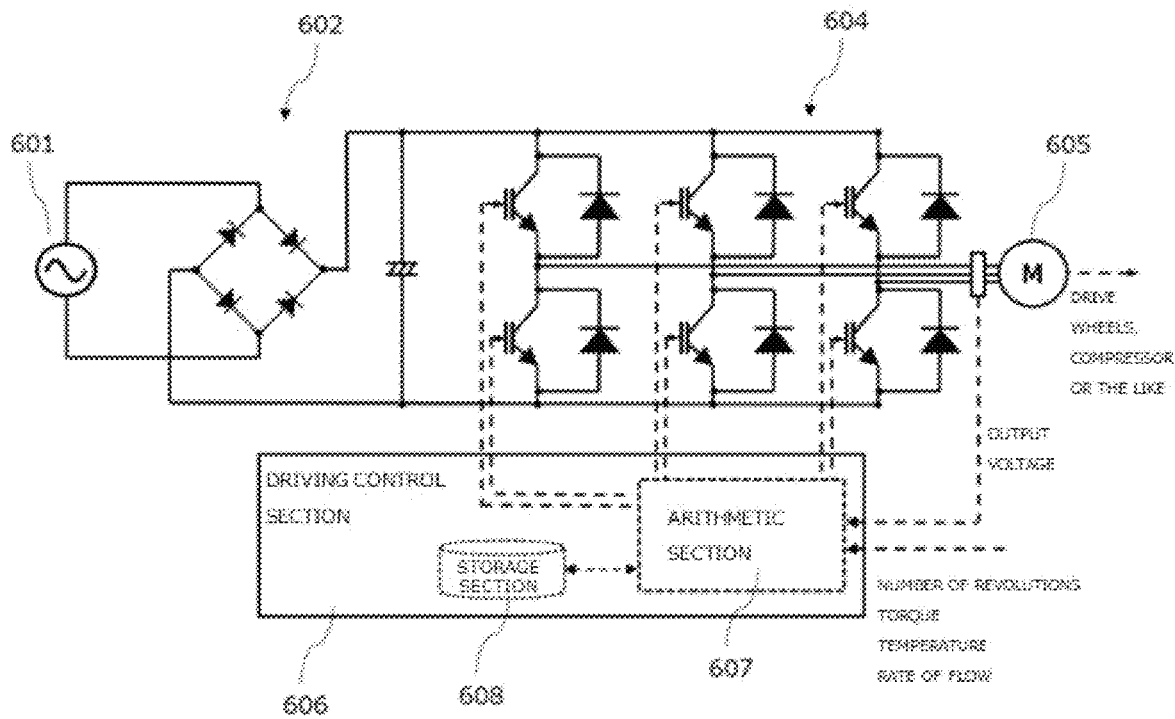
FIG. 11 is a circuit diagram showing one example of the control system adopting the semiconductor device according to an embodiment of the present disclosure.

FIG. 10 is a block configuration diagram showing another example of the control system adopting the semiconductor device according to the embodiment of the present disclosure and FIG. 11 is a circuit diagram of the control system, which is suitable for installation in infrastructure equipment, household electrical appliances and the like which operate by power from an alternating-current power supply.

As shown in FIG. 10, a control system 600 receives the input of power which is supplied from an external three-phase alternating-current power supply (a power supply) 601, for example, and includes an AC/DC converter 602, an inverter 604, a motor (an object to be driven) 605, and a driving control section 606, and they can be installed in various types of equipment (which will be described later). The three-phase alternating-current power supply 601 is a power generation facility (such as a thermal power station, a hydroelectric power station, a geothermal power station, or a nuclear power station) of an electric power company, for example, and the output thereof is stepped down via electric power substations and supplied as an alternating-current voltage. Moreover, the three-phase alternating-current power supply 601 is installed inside a building or a neighboring facility in the form of a private power generator, for example, and the output thereof is supplied by a power cable. The AC/DC converter 602 is a voltage converter that converts an alternating-current voltage into a direct-current voltage and converts an alternating-current voltage of 100 V or 200 V that is supplied from the three-phase alternating-current power supply 601 into a predetermined direct-current voltage. Specifically, an alternating-current voltage of 100 V or 200 V that is supplied from the three-phase alternating-current power supply 601 is converted into a generally used desired direct-current voltage such as 3.3 V, 5 V, or 12 V by voltage conversion. When the object to be driven is a motor, conversion into 12 V is performed. It is to be noted that a single-phase alternating-current power supply may be adopted in place of the three-phase alternating-current power supply; in that case, by using a single-phase input AC/DC converter, it is possible to adopt a system configuration similar to the above-described system configuration.

The inverter 604 converts the direct-current voltage that is supplied from the AC/DC converter 602 into a three-phase alternating-current voltage by switching operation and outputs the three-phase alternating-current voltage to the motor 605. The configuration of the motor 604 varies depending on an object to be controlled. When the object to be controlled is an electric train, the motor 604 is a three-phase alternating-current motor for driving wheels; when the object to be controlled is a plant facility, the motor 604 is a three-phase alternating-current motor for driving pumps and various power sources; when the object to be controlled is a household electrical appliance, the motor 604 is a three-phase alternating-current motor for driving a compressor and so forth. The motor 604 is driven and rotated by the three-phase alternating-current voltage that is output from the inverter 604, and transmits the rotary drive force to an unillustrated object to be driven.

It is to be noted that household electrical appliances, for example, include many objects to be driven to which the direct-current voltage that is output from the AC/DC converter 602 may be supplied as it is (for example, a personal computer, LED lighting equipment, video equipment, and audio equipment); in that case, there is no need to provide the inverter 604 in the control system 600 and, as shown in FIG. 10, the direct-current voltage is supplied to the object to be driven from the AC/DC converter 602. In this case, for example, a direct-current voltage of 3.3 V is supplied to a personal computer or the like and a direct-current voltage of 5 V is supplied to LED lighting equipment or the like.

On the other hand, measured values such as the number of revolutions and torque of the object to be driven or the temperature of the surrounding environment of the object to be driven and the rate of flow therein are measured using unillustrated various kinds of sensors, and these measurement signals are input to the driving control section 606. At the same time, the output voltage value of the inverter 604 is also input to the driving control section 606. Based on these measurement signals, the driving control section 606 provides a feedback signal to the inverter 604 and controls the switching operation performed by the switching elements. This allows the alternating-current voltage that is supplied to the motor 605 by the inverter 604 to be instantaneously corrected, which makes it possible to achieve precise operation control of the object to be driven, whereby stable operation of the object to be driven is achieved. Moreover, as described above, when the object to be driven can be driven by the direct-current voltage, it is also possible to perform feedback control of the AC/DC converter 602 in place of giving feedback to the inverter 604.

FIG. 11 shows the circuit configuration of FIG. 10. As shown in FIG. 11, the semiconductor device of the present disclosure is used for switching control by being adopted in the AC/DC converter 602 and the inverter 604 as a Schottky barrier diode, for example. A circuit configured with Schottky barrier diodes arranged in a bridge configuration, for example, is used as the AC/DC converter 602, and the AC/DC converter 602 performs direct-current conversion by converting and rectifying a negative voltage of an input voltage to a positive voltage. Moreover, in the inverter 604, the semiconductor device of the present disclosure is integrated into a switching circuit in an IGBT and performs switching control. It is to be noted that a capacitor (such as an electrolytic capacitor) is provided between the AC/DC converter 602 and the inverter 604 for stabilization of a voltage.

Furthermore, as shown by dotted lines in FIG. 11, an arithmetic section 607 configured with a CPU and a storage section 608 configured with nonvolatile memory are provided in the driving control section 606. The signal input to the driving control section 606 is provided to the arithmetic section 607 and a necessary arithmetic operation is performed, whereby a feedback signal for each semiconductor element is generated. Moreover, the storage section 608 temporarily holds the arithmetic operation result obtained by the arithmetic section 607, and stores a physical constant, a function and the like, which are necessary for drive control, in the form of a table and outputs them to the arithmetic section 607 as appropriate. A publicly known configuration can be adopted as the arithmetic section 607 and the storage section 608, and their processing capabilities and so forth can also be arbitrarily selected.

Also in such a control system 600, as in the case of the control system 500 shown in FIGS. 8 and 9, a diode and a thyristor, a power transistor, an IGBT, and a MOSFET, which are switching elements, and the like are used for rectification operation and switching operation that are performed in the AC/DC converter 602 and the inverter 604. By using gallium oxide ($Ga_2O_3$), in particular, corundum-type gallium oxide ($\alpha$-$Ga_2O_3$) in these semiconductor elements as a material therefor, the switching characteristics are improved. In addition, by applying the semiconductor film and the semiconductor device according to the present disclosure to these semiconductor elements, it is expected that extremely good switching characteristics will be achieved and it is possible to achieve further miniaturization of the control system 600 and cost reduction. That is, it is expected that each of the AC/DC converter 602 and the inverter 604 will benefit from the effects of the present disclosure, and it is expected that any one of the AC/DC converter 602 and the inverter 604, a combination thereof, and a configuration including the driving control section 606 in addition to them will benefit from the effects of the present disclosure.

It is to be noted that the motor 605 is taken as an example of the object to be driven in FIGS. 10 and 11; the object to be driven is not necessarily limited to an object that mechanically operates and may be many types of equipment that needs an alternating-current voltage. The control system 600 may be applied to any drive control as long as the control system 600 drives an object to be driven by receiving the input of power from an alternating-current power supply and may be installed for drive control to be performed on equipment such as infrastructure equipment (for example, power equipment of a building, a factory or the like, communication equipment, traffic control equipment, water and sewage processing equipment, system equipment, a labor-saving device, and an electric train) and household electrical appliances (for example, a refrigerator, a washing

EXAMPLE

First Example

Figure 13:
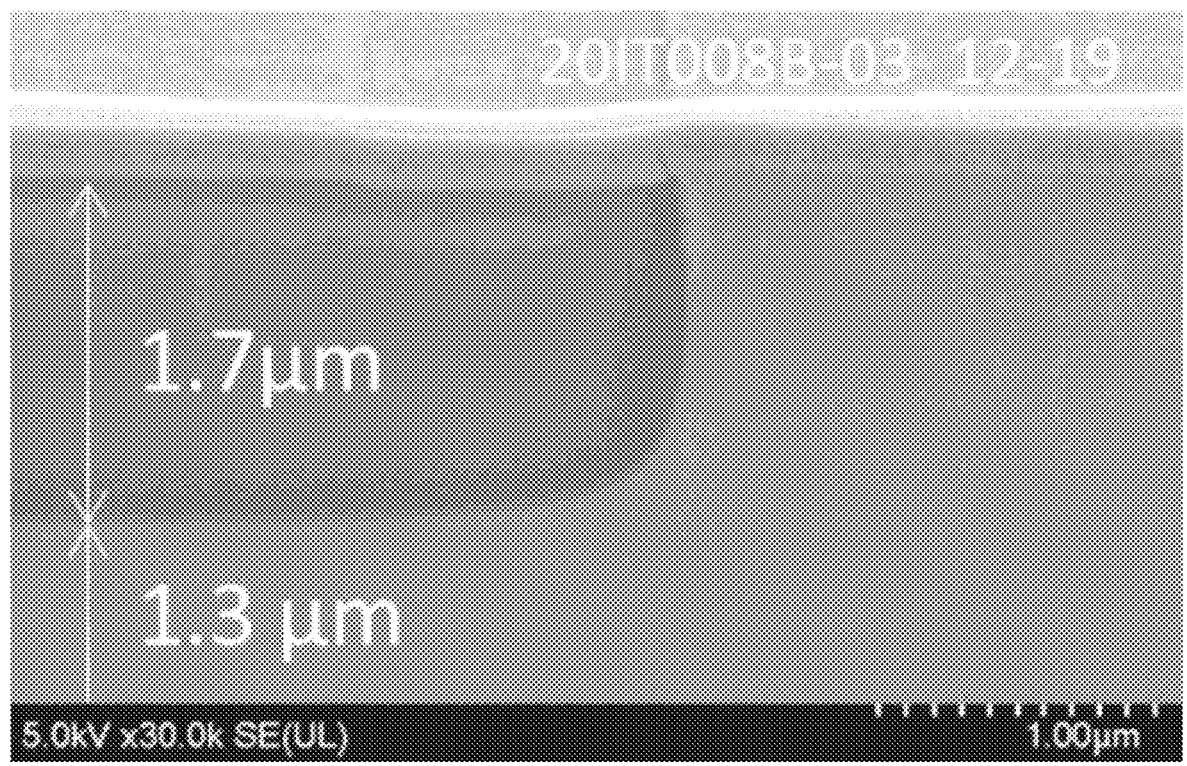
FIG. 13 is a diagram showing the result of observation of a cross section made by a scanning electron microscope (SEM) in an example.
Figure 15:
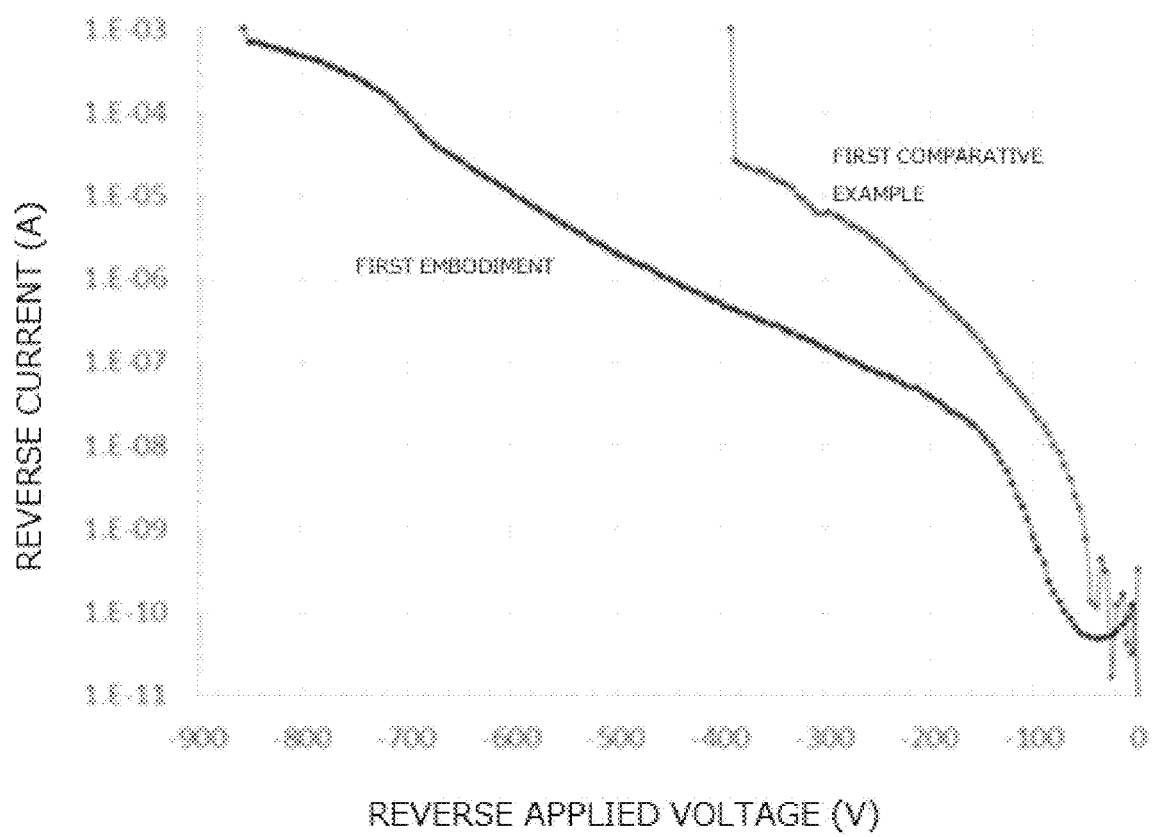
FIG. 15 is a diagram showing the result of I-V measurement in the example and the comparative example.

A Schottky barrier diode (SBD) having a structure modeled after the structure shown in FIG. 1 was fabricated in accordance with the above-described production method and I-V measurement was performed. It is to be noted that the distance between a bottom surface of a high-resistance layer and an upper surface of an n+-type semiconductor layer was set at 1.3 μm. The result of observation of a cross section of the obtained semiconductor device is shown in FIG. 13. The result of I-V measurement indicates that the withstand voltage of the obtained semiconductor device is 850 V. The result reveals that, according to the embodiment of the present disclosure, a leakage current is reduced, which makes it possible to obtain a high-withstand-voltage semiconductor device. It is to be noted that the result of I-V measurement is shown in FIG. 15.

First Comparative Example

Figure 14:
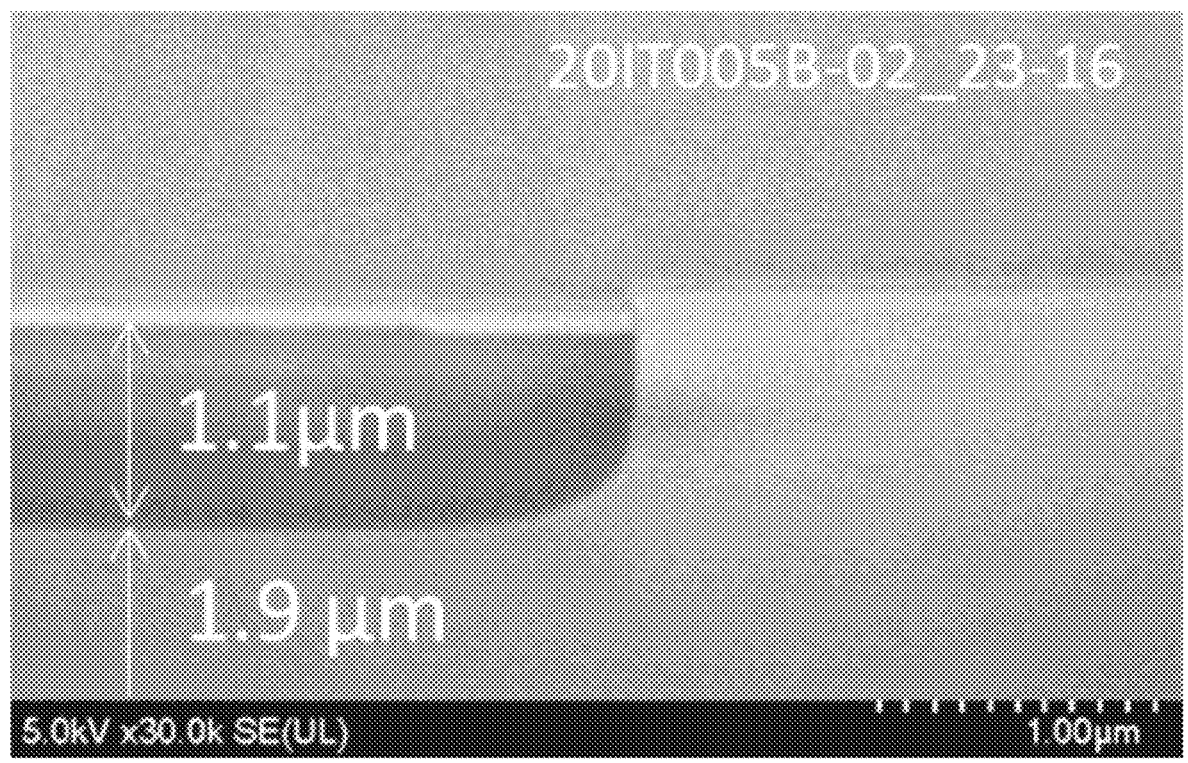
FIG. 14 is a diagram showing the result of observation of a cross section made by the scanning electron microscope (SEM) in a comparative example.

An SBD was fabricated in the same manner as the first example except that the distance between a bottom surface of a high-resistance layer and an upper surface of an n+-type semiconductor layer was set at 1.9 μm. The result of observation of a cross section of the obtained semiconductor device is shown in FIG. 14. The result of I-V measurement indicates that the withstand voltage of the obtained semiconductor device is 385 V. It is to be noted that the result of I-V measurement is shown in FIG. 15.

Second Example

Figure 16:
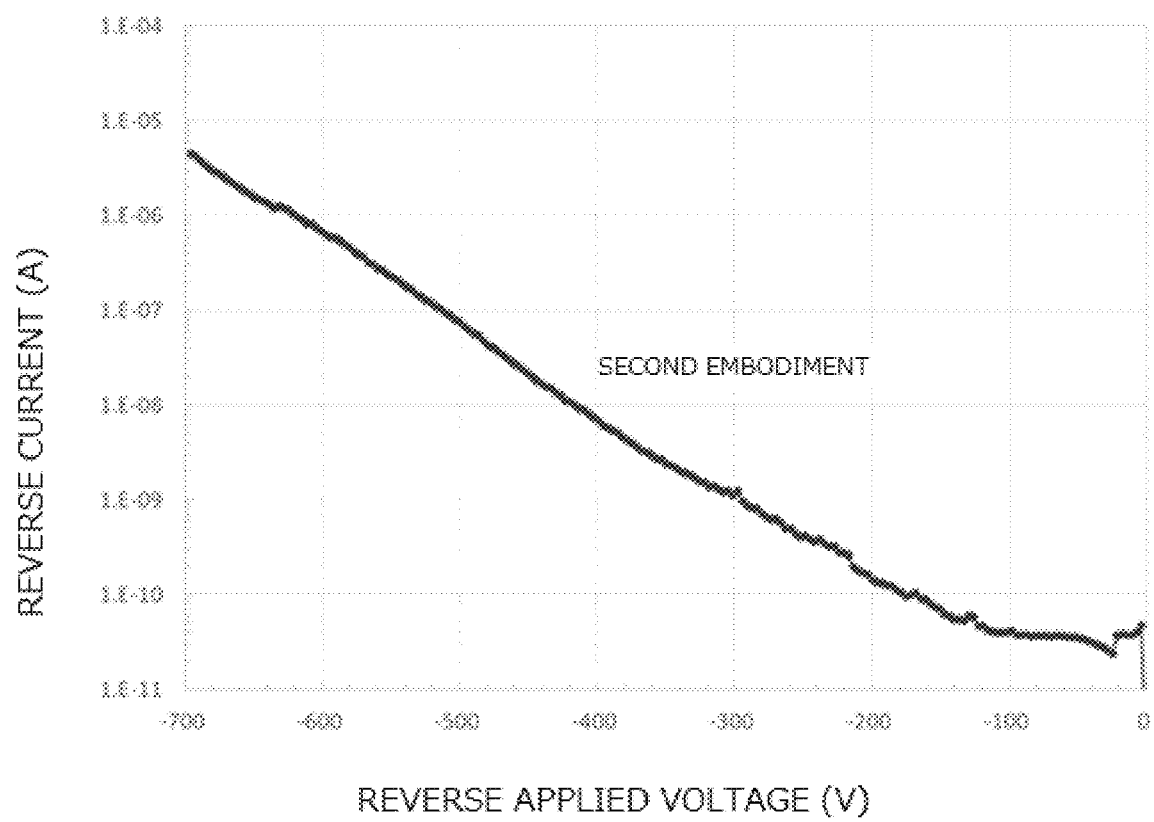
FIG. 16 is a diagram showing the result of I-V measurement in an example.

A semiconductor device was fabricated in the same manner as the first example except that a high-resistance layer was formed in such a way that the distance between a bottom surface of the high-resistance layer and an upper surface of an n+-type semiconductor layer was 1.0 μm or less. I-V measurement was performed on the obtained semiconductor device in the same manner as the first example. The result of I-V measurement is shown in FIG. 16. As is clear from FIG. 16, a leakage current is further reduced as compared with the first example.

Third Embodiment

Figure 18:
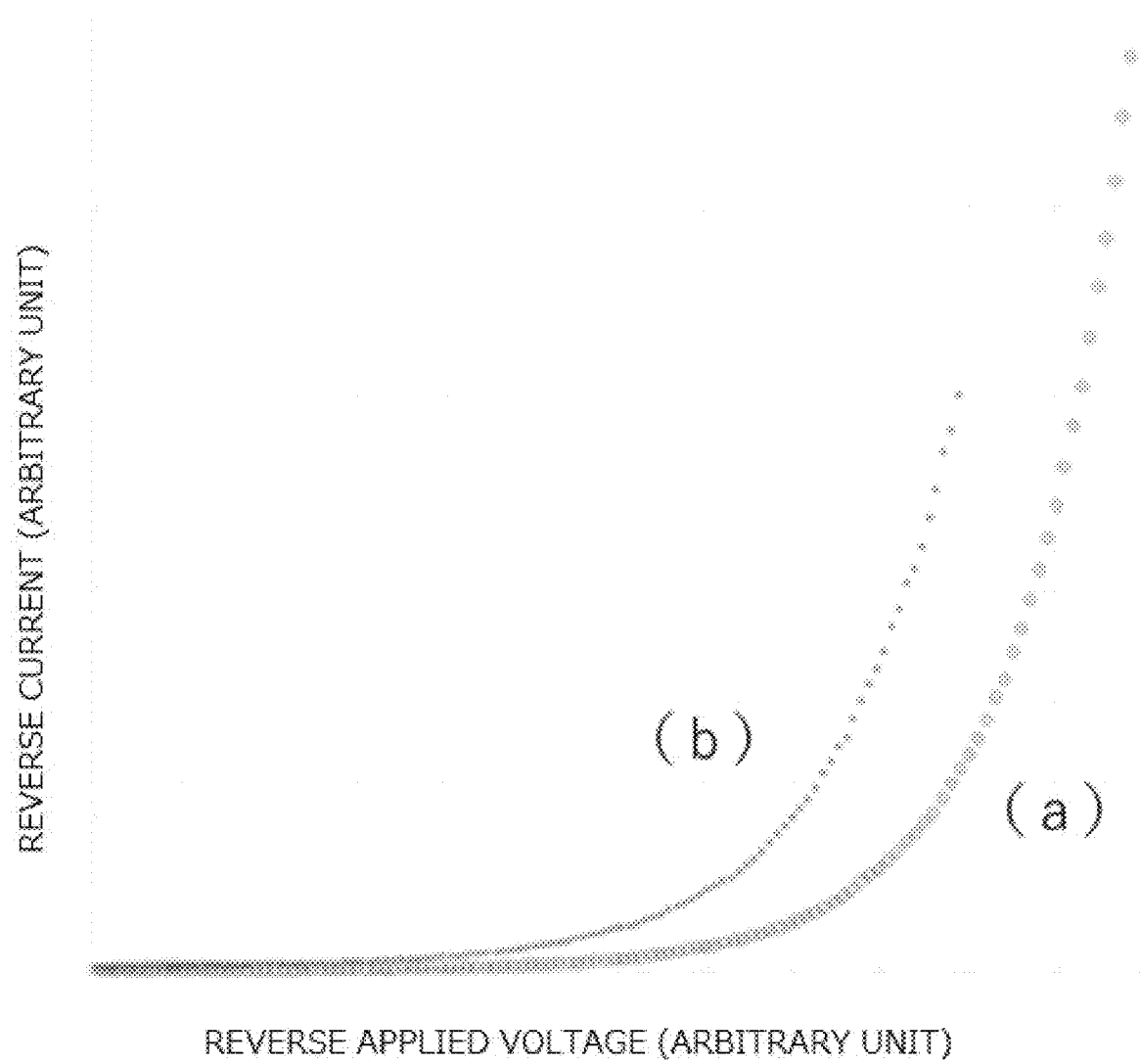
FIG. 18 is a diagram showing the result of I-V measurement in an example. The vertical axis and the horizontal axis are arbitrary unit.

As indicated in a structure shown in FIG. 17, a semiconductor device was fabricated in the same manner as the first embodiment except that a passivation film was formed in addition to a high-resistance layer. For comparison, a semiconductor device without a passivation film was also fabricated in the same manner as the first embodiment. The result of I-V measurement performed on the semiconductor device with a passivation film and a high-resistance layer is shown in FIG. 18 (a), and the result of I-V measurement performed on the semiconductor device without a passivation film (with a high-resistance layer) is shown in FIG. 18 (b). As is clear from FIG. 18, it is possible to achieve a further reduction of a leakage current by using a passivation film in combination with a high-resistance layer.

The semiconductor device of the present disclosure can be used in all the fields such as semiconductors (for example, a compound semiconductor electronic device), electronic parts, electrical apparatus parts, optical and electronic photograph-related equipment, and industrial components, and is useful for power devices in particular.

The embodiments of the present invention are exemplified in all respects, and the scope of the present invention includes all modifications within the meaning and scope equivalent to the scope of claims.

REFERENCE SIGNS LIST 1 film forming equipment (mist CVD equipment)
2a carrier gas source
2b carrier gas (dilute) source
3a flow control valve
3b flow control valve
4 mist generation source
4a raw material solution
4b raw material particles
5 container
5a water
6 ultrasonic vibrator
7 film formation chamber
8 hot plate
9 supply pipe
10 substrate
101 semiconductor layer
101a n--type semiconductor layer
101b n+-type semiconductor layer
102 ohmic electrode
103 Schottky electrode
104 insulator layer
106 high-resistance layer
106a first region
106b second region
107 high-resistance layer
108 passivation film
500 control system
501 battery (power supply)
502 step-up converter
503 step-down converter
504 inverter
505 motor (object to be driven)
506 driving control section
507 arithmetic section
508 storage section
600 control system
601 three-phase alternating-current power supply (power supply)
602 AC/DC converter
604 inverter
605 motor (object to be driven)
606 driving control section
607 arithmetic section
608 storage section

What is claimed is:
1. A semiconductor device comprising at least:
an n+-type semiconductor layer, which contains a crystalline oxide semiconductor as a major component;
an n--type semiconductor layer that is placed on the n+-type semiconductor layer, the n--type semiconductor layer containing a crystalline oxide semiconductor as a major component;
a high-resistance layer with at least a part thereof being embedded in the n--type semiconductor layer, the high-resistance layer having a bottom surface located at a distance of less than 1.5 μm from an upper surface of the n+-type semiconductor layer; and a Schottky electrode that forms a Schottky junction with the n--type semiconductor layer, the Schottky electrode having an edge located on the high-resistance layer.

2. The semiconductor device according to claim 1, wherein the crystalline oxide semiconductor contains one or more metals selected from aluminum, indium, and gallium.

3. The semiconductor device according to claim 1, wherein the crystalline oxide semiconductor contains at least gallium.

4. The semiconductor device according to claim 1, wherein the crystalline oxide semiconductor has a corundum structure or a β gallia structure.

5. The semiconductor device according to claim 1, wherein a distance between the bottom surface of the high-resistance layer and the upper surface of the n+-type semiconductor layer is 1.0 μm or less.

6. The semiconductor device according to claim 1, wherein the bottom surface of the high-resistance layer is flush with an interface between the n+-type semiconductor layer and the n--type semiconductor layer or is located below the interface between the n+-type semiconductor layer and the n--type semiconductor layer.

7. The semiconductor device according to claim 1, wherein the high-resistance layer contains $SiO_2$.

8. The semiconductor device according to claim 1, further comprising:

an insulator layer that is formed on the n--type semiconductor layer, the insulator layer on which the edge of the Schottky electrode is located.

9. The semiconductor device according to claim 1, wherein the high-resistance layer has a first region located on an inside of the semiconductor device and a second region located on an outside of the semiconductor device, wherein a distance between a bottom surface of the first region and the upper surface of the n+-type semiconductor layer is less than 1.5 μm, and wherein a bottom surface of the second region is located above the bottom surface of the first region.

10. The semiconductor device according to claim 1, further comprising:

a passivation film that covers an outer edge of the Schottky electrode and at least a part of a surface of the n--type semiconductor layer.

11. The semiconductor device according to claim 1, wherein the semiconductor device is a diode.

12. The semiconductor device according to claim 1, wherein the semiconductor device is a power device.

13. A power converter, wherein the semiconductor device according to claim 1 is used.

14. A control system, wherein the semiconductor device according to claim 1 is used.

* * * * *